(12) United States Patent
Kim et al.

(10) Patent No.: US 12,094,970 B2
(45) Date of Patent: Sep. 17, 2024

(54) ELECTROSTATIC DISCHARGE GUARD RING WITH COMPLEMENTARY DRAIN EXTENDED DEVICES

(71) Applicant: Texas Instruments Incorporated, Dallas, TX (US)

(72) Inventors: Sunglyong Kim, Allen, TX (US); Seetharaman Sridhar, Richardson, TX (US); Sameer Pendharkar, Allen, TX (US); David LaFonteese, Redwood City, CA (US)

(73) Assignee: Texas Instruments Incorporated, Dallas, TX (US)

( * ) Notice: Subject to any disclaimer, the term of this patent is extended or adjusted under 35 U.S.C. 154(b) by 618 days.

(21) Appl. No.: 17/174,023

(22) Filed: Feb. 11, 2021

(65) Prior Publication Data

US 2021/0167206 A1 Jun. 3, 2021

Related U.S. Application Data

(62) Division of application No. 15/790,780, filed on Oct. 23, 2017, now Pat. No. 10,950,720.

(51) Int. Cl.
*H01L 29/78* (2006.01)
*H01L 27/02* (2006.01)
(Continued)

(52) U.S. Cl.
CPC ...... *H01L 29/7816* (2013.01); *H01L 27/0255* (2013.01); *H01L 27/0262* (2013.01);
(Continued)

(58) Field of Classification Search
CPC ............. H01L 29/7816; H01L 27/0255; H01L 27/0262; H01L 27/0266; H01L 27/027;
(Continued)

(56) References Cited

U.S. PATENT DOCUMENTS 6,873,021 B1 * 3/2005 Mitros ................ H01L 29/7801
257/E29.066
6,940,131 B2 * 9/2005 Baldwin ............. H01L 27/0266
257/605

(Continued)

OTHER PUBLICATIONS

Liu et al., Research Article—The Investigation of Field Plate Design in 500 V High Voltage N LDMOS, 2015, Advances in Condensed Matter Physics, vol. 2015, Article ID 834545, pp. 1-6 (Year: 2015).

*Primary Examiner* — Michael Lebentritt
(74) *Attorney, Agent, or Firm* — Andrew R. Ralston; Frank D. Cimino

(57) ABSTRACT

An electrostatic discharge (ESD) protection structure that provides snapback protections to one or more high voltage circuit components. The ESD protection structure can be integrated along a peripheral region of a high voltage circuit, such as a high side gate driver of a driver circuit. The ESD protection structure includes a p-channel device and an n-channel device. The p-channel device includes an n-type barrier region circumscribing a p-type drain region with an n-type body region. The p-channel device may be positioned adjacent to the n-channel device and a high voltage junction diode.

20 Claims, 11 Drawing Sheets

(51) Int. Cl.
*H01L 29/06* (2006.01)
*H01L 29/08* (2006.01)
*H01L 29/10* (2006.01)
*H01L 29/40* (2006.01)
*H01L 29/423* (2006.01)
*H02H 9/04* (2006.01)
*H03K 19/0185* (2006.01)

(52) U.S. Cl.
CPC ........ *H01L 27/0266* (2013.01); *H01L 27/027* (2013.01); *H01L 27/0285* (2013.01); *H01L 29/063* (2013.01); *H01L 29/0878* (2013.01); *H01L 29/0882* (2013.01); *H01L 29/7835* (2013.01); *H01L 29/1083* (2013.01); *H01L 29/1095* (2013.01); *H01L 29/404* (2013.01); *H01L 29/42368* (2013.01); *H02H 9/044* (2013.01); *H02H 9/046* (2013.01); *H03K 19/018507* (2013.01)

(58) Field of Classification Search
CPC ............... H01L 27/0285; H01L 29/063; H01L 29/0878; H01L 29/0882; H01L 29/7835; H01L 29/1083; H01L 29/1095; H01L 29/404; H01L 29/42368; H02H 9/044; H02H 9/046; H03K 19/018507; H03K 19/00346

See application file for complete search history.

(56) References Cited

U.S. PATENT DOCUMENTS

| | | | |
|---|---|---|---|
| 2004/0229438 A1* | 11/2004 | Moscatelli | H01L 29/6659 257/E29.268 |
| 2013/0026576 A1* | 1/2013 | Stockinger | H01L 27/0255 438/237 |
| 2013/0093017 A1* | 4/2013 | Ko | H01L 29/66659 257/E21.409 |
| 2014/0167171 A1* | 6/2014 | Kaya | H01L 21/761 257/367 |
| 2014/0339601 A1* | 11/2014 | Salcedo | H01L 27/0817 257/140 |
| 2015/0008539 A1* | 1/2015 | Kanda | H01L 29/1095 257/409 |
| 2015/0221720 A1* | 8/2015 | Mallikarjunaswamy | H01L 29/0619 257/495 |
| 2017/0084739 A1 | 3/2017 | Hsaio | |

* cited by examiner

ELECTROSTATIC DISCHARGE GUARD RING WITH COMPLEMENTARY DRAIN EXTENDED DEVICES

This application is a divisional of prior application Ser. No. 15/790,780, filed Oct. 23, 2017, currently pending.

BACKGROUND

Motorized machines include driver circuits for controlling the operations of one or more motors. Each of these driver circuits may include a high side gate driver and a low side gate driver. The high side gate driver is configured to convert low voltage input signals (e.g., less than 15V) to high voltage signals for delivery at the gate of a high side switch where voltage may swing from 0V to 600V. The low side gate driver is configured to deliver low voltage input signals to the gate of a low side switch (e.g., less than 15V). These high voltage signals and low voltage signals are delivered to a motorized load for controlling one or more motor operations.

During an electrostatic discharge (ESD) event, the high side gate driver may receive a large amount of current in a short period of time. If the ESD current is not properly dissipated, it may create a large amount of voltage build-up within the high side gate driver. This high voltage build-up may cause damages to the high side gate driver, and it may potentially be hazardous to human operators who operate the motorized machines. To prevent high ESD voltage from building up within the high side gate driver, several ESD protection devices may be deployed. However, these ESD protection devices are typically large in size and may be area inefficient where the driver circuits have significant area constrains.

SUMMARY

The present disclosure describes systems and techniques relating to the manufacturing of an electrostatic discharge (ESD) protection structure that provides snapback protections to one or more high voltage circuit components. The disclosed ESD protection structure is size efficient as it may be integrated along a peripheral region of a high voltage circuit, such as a high side gate driver of a driver circuit. The disclosed ESD protection structure includes a bipolar transistor structure interfacing with a PN junction of a high voltage device, which is configured to discharge the ESD current during an ESD event. The bipolar transistor structure has a collector region near the PN junction, a base region embedded with sufficient pinch resistance to launch the snapback protection, and an emitter region for discharging the ESD current. Advantageously, the disclosed ESD protection structure may protect against ESD events characterized by high voltages (e.g., 1 kV or above) and high current density (e.g., 1 µA/µm) without imposing significant area penalty on an integrated circuit die.

In one implementation, for example, the present disclosure introduces an integrated circuit having a semiconductor substrate, a buried layer, and a peripheral structure. The semiconductor substrate has a first conductivity type and a top surface defining a circuit region and a peripheral region that laterally surrounds the circuit region. The buried layer is formed under the top surface of the semiconductor substrate. The buried layer is positioned within the circuit region and adjacent to the peripheral region. The buried layer having a second conductivity type opposite to the first conductivity type. The peripheral structure is positioned within the peripheral region and adjacent to the top surface. The peripheral structure includes a first contact region having the first conductivity type, and a second contact region having the second conductivity type. The second contact region is interposed between the buried layer and the first contact region.

In another implementation, for example, the present disclosure introduces an integrated circuit having a semiconductor substrate, a diode, a lateral drain (or lateral double diffused) metal oxide semiconductor (LDMOS) transistor, and a peripheral structure. The semiconductor substrate has a P-type dopant and a top surface defining a circuit region and a peripheral region that laterally surrounds the circuit region. The diode has a cathode region that is positioned within the circuit region and adjacent to the peripheral region. The cathode region includes an N-type dopant. The LDMOS transistor is positioned within the circuit region and adjacent to the peripheral region, the LDMOS transistor having a lateral drain region separated from the cathode region. The lateral drain region includes the N-type dopant as well. The peripheral structure is positioned within the peripheral region and adjacent to the top surface. The peripheral structure including a first contact region having the P-type dopant, and a second contact region having the N-type dopant. The second contact region is interposed between the first contact region and the cathode region, and it is also interposed between the first contact region and the lateral drain region.

DRAWING DESCRIPTIONS

Like reference symbols in the various drawings indicate like elements. Details of one or more implementations of the present disclosure are set forth in the accompanying drawings and the description below. The figures are not drawn to scale and they are provided merely to illustrate the disclosure. Specific details, relationships, and methods are set forth to provide an understanding of the disclosure. Other features and advantages may be apparent from the description and drawings, and from the claims.

DETAILED DESCRIPTION

Figure 1:
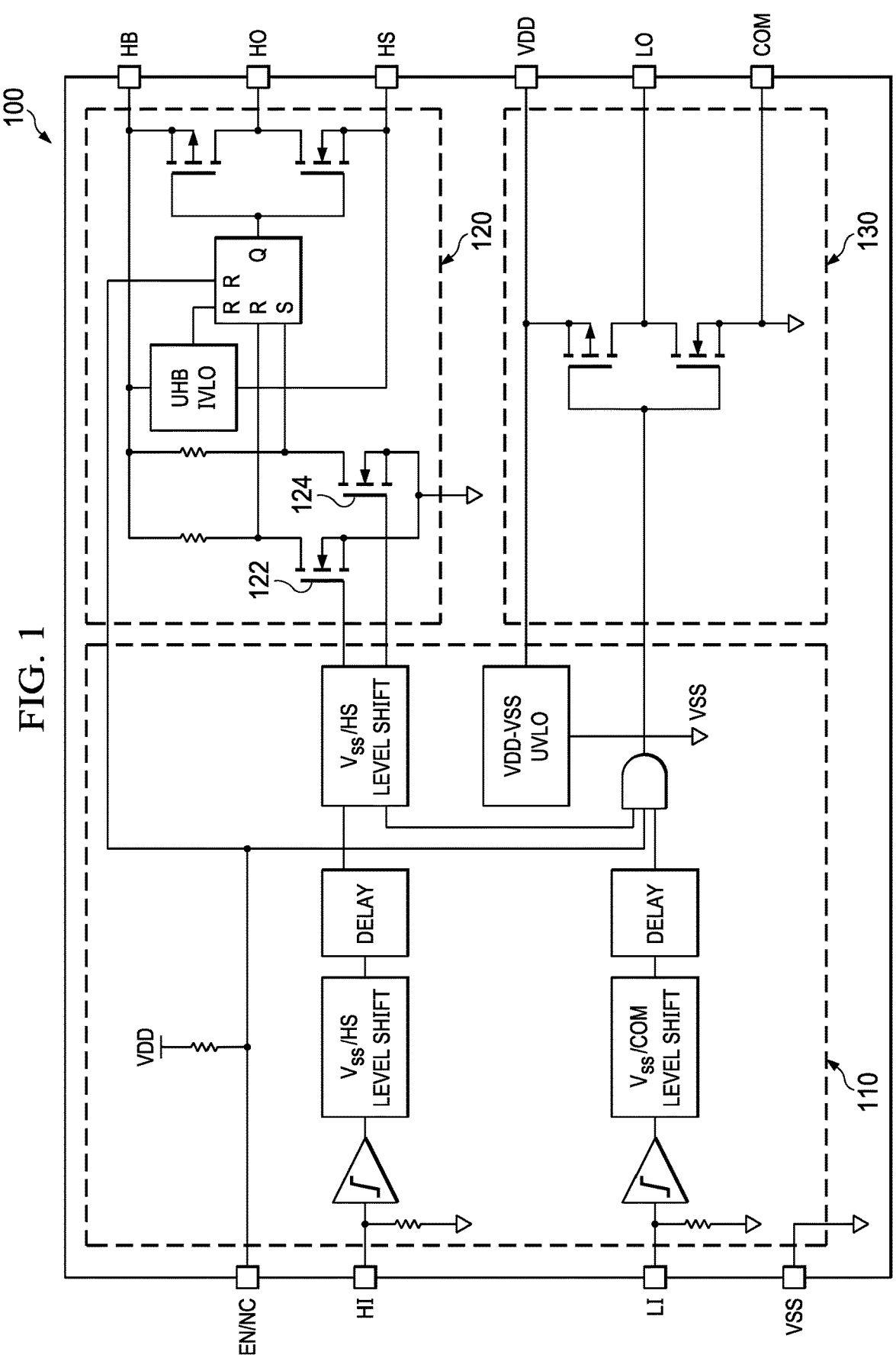
FIG. 1 shows a schematic view of a driver integrated circuit according to an aspect of the present disclosure.

FIG. 1 shows a schematic view of a driver integrated circuit 100 according to an aspect of the present disclosure. The driver integrated circuit 100 includes a low voltage control circuit (LVC) 110, a high side gate driver circuit (HSGD) 120, and a low side gate driver circuit (LSGD) 130. In general, the driver integrated circuit 100 serves as an interface between a backend system (not shown) and a motorized load (not shown). The backend system is configured to generate one or more control signals for driving the motorized load. The driver integrated circuit 100 is configured to process and level-shift the control signals for delivery to the motorized load. Moreover, the driver integrated circuit 100 protects the backend system from high voltages and surge currents generated by the motorized load.

The LVC 110 interfaces with the backend system using the EN/NC pad, the HI pad, the LI pad, and the VSS pad. The EN/NC pad is configured to receive an Enable signal from the backend system. The Enable signal is configured to indicate whether the driver integrated circuit 100 can be operated without the EN pin connection. If the EN pin is connected, it can be either enabled or disabled for operation. The HI pad is configured to receive a high side input signal from the backend system. The high side input signal is configured to drive the HO pin to a high voltage if it has a high state, and it is configured to drive the HO pin to a low voltage (e.g., 0V) if it has a low state. The LI pad is configured to receive a low side input signal from the backend system. Similar to the high side input signal, the low side input signal is configured to drive low side switch by controlling LO output. The VSS pad is configured to receive a ground supply voltage (VS S) from the backend system or from an external voltage source.

The LSGD 130 interfaces with the backend system using the VDD pad and the COM pad. The VDD pad is configured to receive a regulated voltage (VDD) from the backend system or an external low voltage source (e.g., 15V or lower). The COM pad is configured to receive a common signal from the backend system. The common signal is configured to receive a ground supply voltage in certain applications. The LSGD 130 also interfaces with the motorized load using the LO pad. In particular, the LO pad is configured to deliver a low side output signal to a low side gate device in the motorized load. The low side output signal is generated based on the control signal received by the LI pad.

The HSGD 120 interfaces with the motorized load using the HO pad, which is configured to deliver a signal that may swing from 0V to approximately 700V. In particular, the HO pad is configured to deliver a high side output signal to a high side gate device in the motorized load. The high side output signal is generated based on the control signal received by the LO pad. The HSGD 120 includes a first lateral drain (or lateral double diffused) metal oxide semiconductor (LDMOS) transistor 122 and a second LDMOS transistor 124, each of which is a drain extended device. Collectively, the first and second LDMOS transistors 122 and 124 are configured to convert a low voltage input signal (e.g., 15V or less) from the HI pad to generate a high voltage (e.g., approximately 700V) output signal delivered by the HO pad. The HB pad serves similar functions as the VDD pad in the LGSD 130, whereas the HS pad serves similar functions as the COM pad in the LGSD 130. In general, the potential difference between the HB pad and the HS pad is substantially equal to the potential difference between the VDD pad and the COM pad. Unlike the COM pad, which is typically coupled to a Ground (e.g., 0V) supply source, the HS pad is configured to float from 0V to 700V.

The HSGD 120 is isolated to protect the LVC 110 and the LSGD 130 from high voltage operations and from electrostatic discharge (ESD) events associated with the high voltage pads HB, HO, and HS. While ESD events may be introduced by all pins, including pins in the LVC 110, the ESD protection among the pins in the LVC 110 is a lesser concern where separate ESD device can be used without a substantial size penalty. By contrast, protecting the LVC 110 from the ESD events of the LSGD 130 may call for a much larger ESD device.

During an ESD event, an ESD voltage (e.g., 1 kV to 2 kV) may be established between one or more of the high voltage pads HB, HO, and HS on the one hand, and the COM pad on the other hand. To alleviate the ESD voltage, the LDMOS transistor 122 and 124 are triggered to deliver an ESD current in the range of 1 A. Due to overheating as a result of high current density, the LDMOS transistors 122 and 124 may be damaged when the ESD voltage is above a certain threshold (e.g., 1.4 kV) under the Human-Body Model (HBM) ESD standard.

To reduce the current density of the ESD current, the LDMOS transistors 122 and 124 may be widened with larger gate width. Such an approach however, may impose significant area penalty on the overall die size of the driver integrated circuit 100. For example, the gate width of each LDMOS transistors 122 and 124 may be seven times larger in order to sustain a 1.4 kV HBM ESD voltage threshold. The enlarged gates also demand additional gate pull up circuits, which will further increase the die size.

To overcome these issues, the present disclosure introduces an ESD protection structure that can sustain the flow of a high ESD current and meet the HBM ESD standard without incurring significant die area penalty. The disclosed ESD protection structure provides snapback protections to one or more PN junctions of high voltage circuit components, such as the LDMOS transistors 122 and 124. Advantageously, the disclosed ESD protection structure is size efficient as it may be integrated along a peripheral region of a high voltage circuit, such as the HSGD 120.

Figure 2:
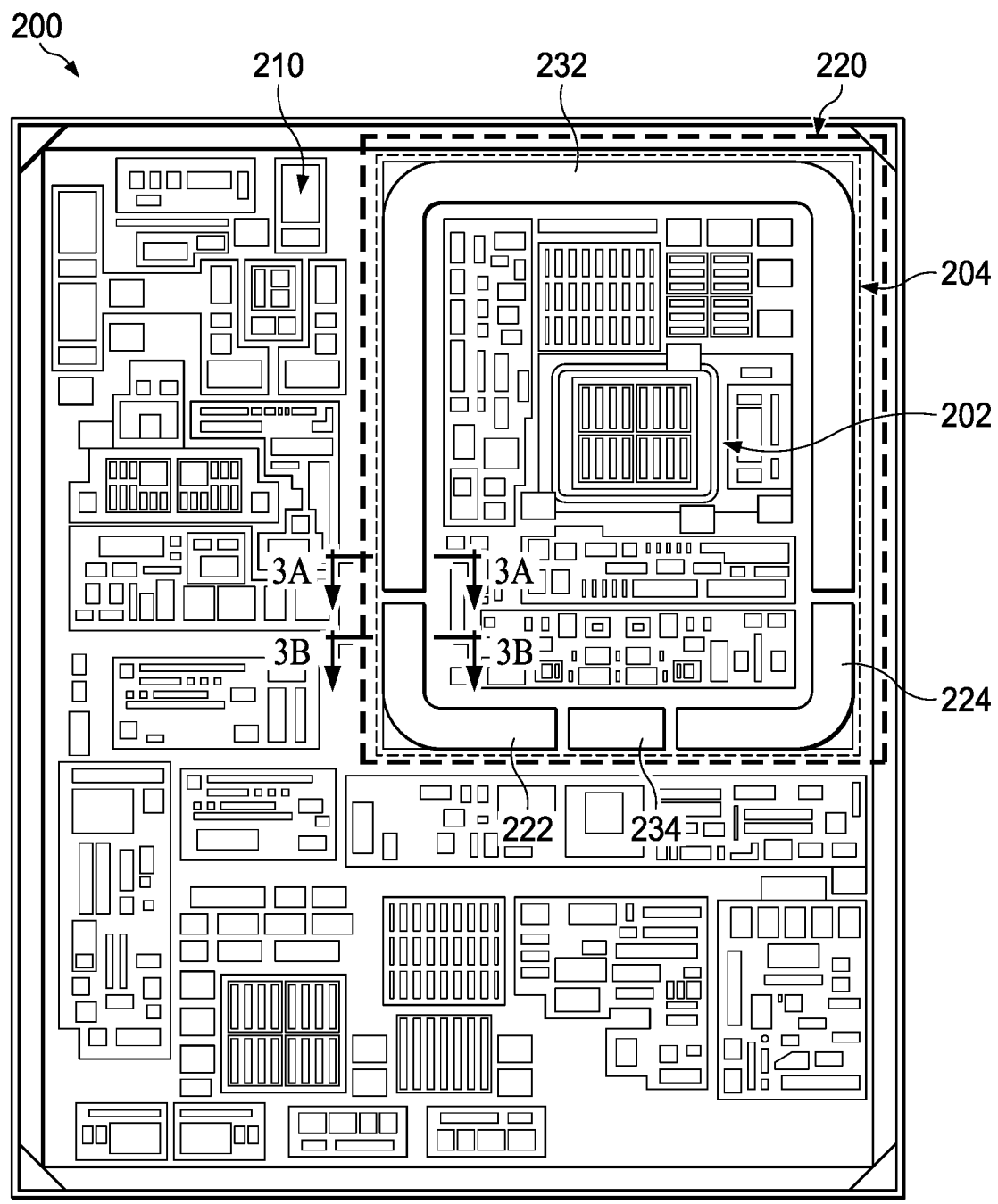
FIG. 2 shows a top exposed view of a driver integrated circuit according to an aspect of the present disclosure.

As shown in FIG. 2, for example, a layout of a driver integrated circuit 200 incorporates a version of the disclosed ESD structure for implementing the driver integrated circuit 100. The driver integrated circuit 200 includes a high voltage region 220 and a low voltage region 210. The high voltage region 220 includes the layout of the HSGD 120, whereas the low voltage region 210 includes the layout of the LSGD 130 and the LVC 110. In general, the high voltage region 220 is isolated from the low voltage region 210 to protect the low voltage region 210 (e.g., 15V or below) from high voltage operations (e.g., up to about 700V).

The high voltage region 220 includes a circuit region 202 and a peripheral region 204. The circuit region 202 includes circuit components of the HSGD 120, such as the LDMOS transistors 122 and 124. In one implementation, for example, the LDMOS transistors 122 and 124 may be located along a high voltage diode area at the two bottom corners of the peripheral region 204. The peripheral region 204 laterally surrounds the circuit region 202 to form a guard ring for isolating the high voltage operations performed therein. According to an aspect of the present disclosure, one or more peripheral ESD protection structures (hereinafter the "peripheral structures") may be positioned within the peripheral region 204. According to another aspect of the present disclosure, the peripheral structures may serve as an ESD protection means for providing snapback protections from an ESD event. According to yet another aspect of the present disclosure, the peripheral structures may serve as an ESD protection means for conducting an ESD current away from one or more circuit components in the circuit region 202.

For example, the peripheral region 204 may include a first peripheral structure 222, a second peripheral structure 224, a third peripheral structure 232, and a fourth peripheral structure 234. The first and second peripheral structures 222 and 224 may have substantially the same structure, and they may each serve as a means for protecting a transistor (e.g., LDMOS transistors 122 and 124) within the circuit region 202. A cross-sectional view of the first peripheral structure 222 is shown in FIG. 3B to illustrate its structural arrangement with a high voltage transistor. Similarly, the third and fourth peripheral structures 232 and 234 may have substantially the same structure, and they may each serve as a means for protecting an avalanche diode within the circuit region 202. A cross-sectional view of the first peripheral structure 222 is shown in FIG. 3A to illustrate its structural arrangement with an avalanche diode.

To the extent that the first, second, third, and fourth peripheral structures 222, 224, 232, and 234 are substantially the same, these peripheral structures may extend contiguously within the peripheral region 204. As such, the peripheral structures 222, 224, 232, and 234 may form a contiguous ESD guard ring that laterally surrounds the circuit 202. Alternatively, the first, second, third, and fourth peripheral structures 222, 224, 232, and 234 may have different geometrical features from one another. In that case, the peripheral structures 222, 224, 232, and 234 may be segmented within the peripheral region 204. The segmented first, second, third, and fourth peripheral structures 222, 224, 232, and 234 may form a segmented ESD guard ring that laterally surrounds the circuit region 202

Figure 3A:
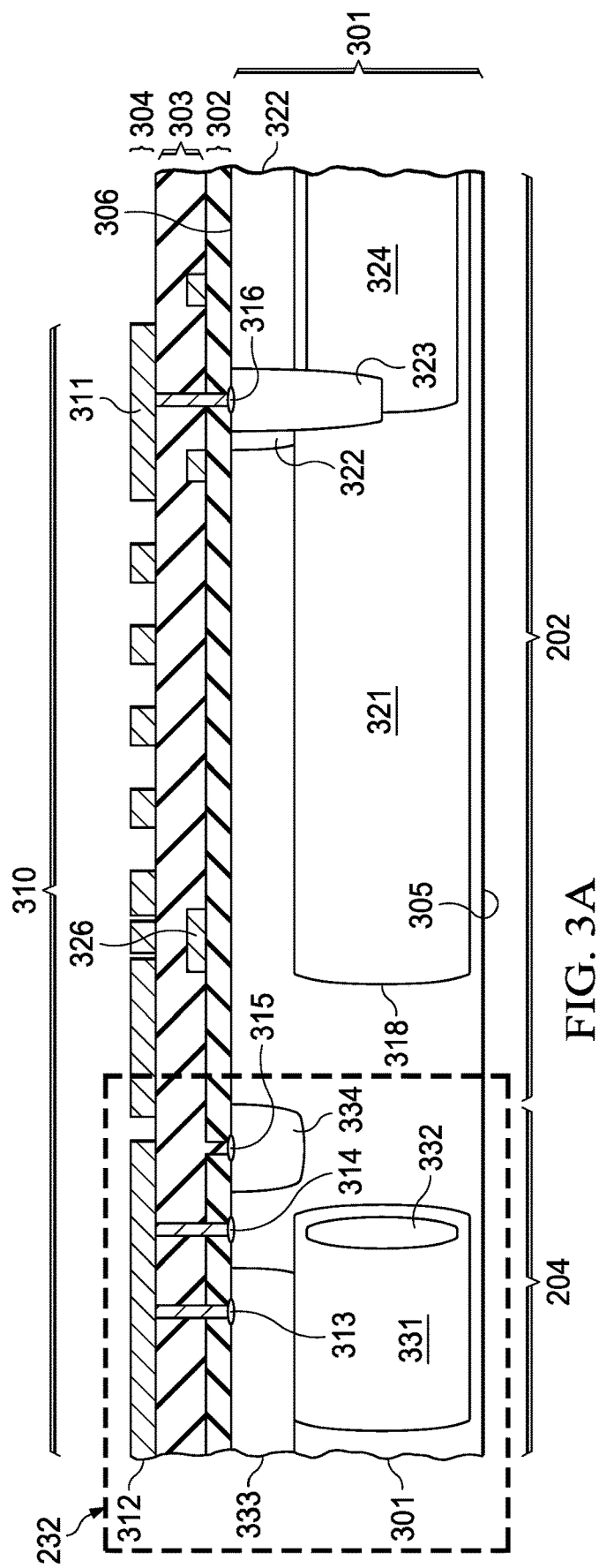
FIGS. 3A-3C show cross-sectional views of the peripheral structures according to an aspect of the present disclosure.
Figure 3B:
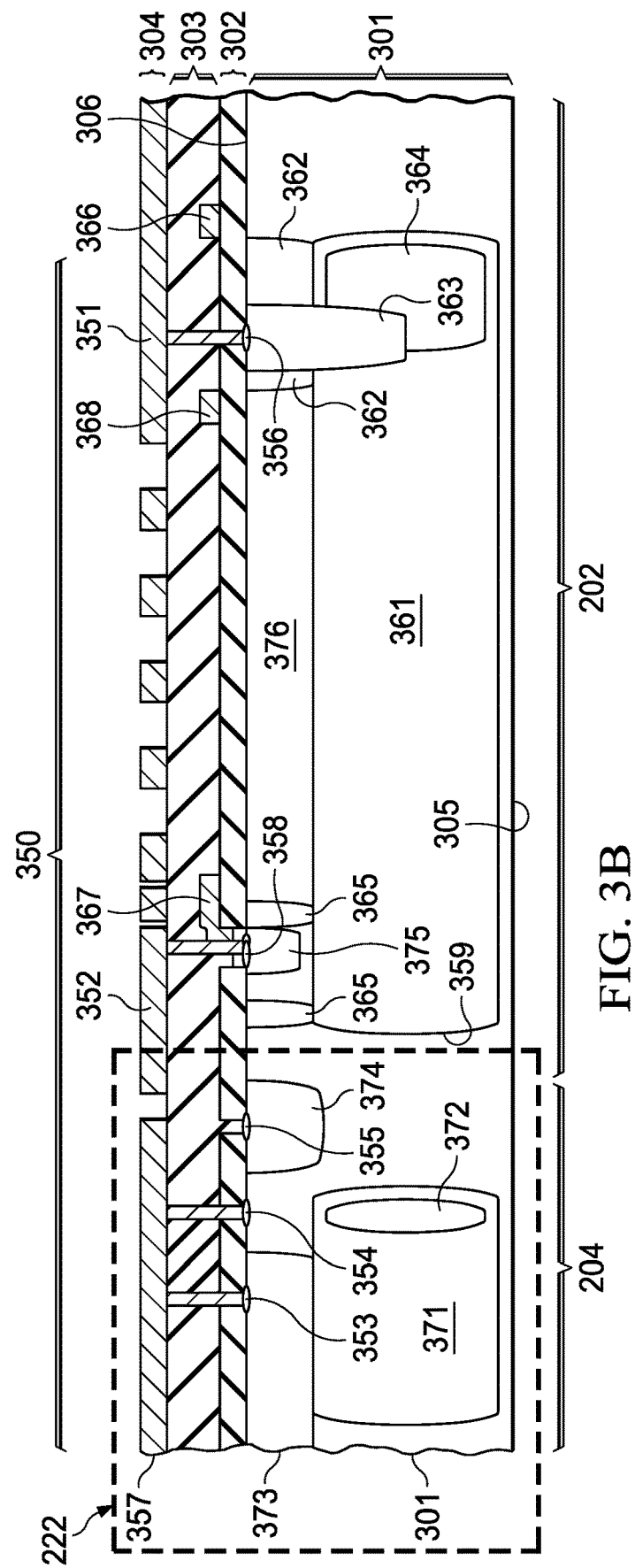

Referring to FIG. 3A, which shows a cross-sectional view of the driver integrated circuit 200, the peripheral structure 232 is configured to protect an avalanche diode 310. As a part of an integrated circuit die, the peripheral structure 232 and the avalanche diode 310 are formed on a semiconductor substrate 301. The semiconductor substrate 301 has a bottom surface 305 and a top surface 306 that faces away from the bottom surface 305. The semiconductor substrate 301 may be a single bulk substrate (e.g., single silicon crystalline substrate) or may include additional epitaxial layers developed thereon. The semiconductor substrate 301 may have a first conductive type. For example, the semiconductor substrate 301 may include a P-type carrier (e.g., Boron) and have a carrier concentration ranging from $5 \times 10^{13}$ cm$^{-3}$ to $5 \times 10^{14}$ cm$^{-3}$.

One or more buried doped layers (e.g., 321, and 324, 331, 332) may be developed under the top surface 306 of the semiconductor substrate 301. For instance, a buried doped layer (e.g., 321, and 324, 331, 332) may be developed 1 µm below the top surface 306. The buried doped layer (e.g., 321, and 324, 331, 332) can be developed by epitaxial growth or by deep ion implantation. In general, the buried doped layer (e.g., 321, and 324, 331, 332) has a second conductivity type that is the opposite of the first conductivity type. For instance, the buried doped layer (e.g., 321, and 324, 331, 332) includes an N-type dopant (e.g., Phosphorus, Arsenic and/or Antimony) where the semiconductor substrate 301 includes a P-type carrier (e.g., Boron). Conversely, the buried doped layer (e.g., 321, and 324, 331, 332) includes a P-type dopant where the semiconductor substrate 301 includes an N-type carrier. In either case, the buried doped layer (e.g., 321, and 324, 331, 332) and the semiconductor substrate 301 form one or more PN junctions. These PN junctions may experience avalanche breakdowns during an ESD event.

The driver integrated circuit 200 includes an avalanche diode 310 within the proximity of the peripheral structure 232. The avalanche diode 310 has a cathode region and an anode region. In general, the cathode region includes N-type dopants and the anode region includes P-type dopants. Positioned within the circuit region 202, the cathode region of the avalanche diode 310 includes an electrode 311, a contact region 316, a doped region 322, a heavily doped region 323, a doped buried layer 321, and a heavily doped buried layer 324. The electrode 311 is a cathode electrode formed as a part of an interconnect metal layer 304, which is positioned on a dielectric layer 303 and a field oxide layer 302. The contact region 316 is a cathode contact region that can be formed with an N-doped silicide layer connected to the electrode 311.

The doped region 322 is an N-doped region that extends from the contact region 316 to the buried layer 321 and the heavily doped buried layer 324. The heavily doped buried layer 324 has a higher doping concentration of N-type dopants than the buried layer 321. For instance, the heavily doped buried layer 324 may have a doping concentration ranges from $1 \times 10^{18}$ cm$^{-3}$ to $1 \times 10^{21}$ cm$^{-3}$, whereas the buried layer 321 may have a doping concentration ranges from $1 \times 10^{14}$ cm$^{-3}$ to $1 \times 10^{17}$ cm$^{-3}$. To enhance the breakdown characteristic of the avalanche diode 310, the buried layer 321 may serve as a lateral drift region of the heavily doped buried layer 324.

The heavily doped region 323 has a higher doping concentration of N-type dopants than the doped region 322 for reducing the resistance between the contact region 316 and the buried layers 321 and 324. For instance, the heavily doped region 323 may have a doping concentration ranges from $1 \times 10^{18}$ cm$^{-3}$ to $1 \times 10^{21}$ cm$^{-3}$, whereas the doped region 322 may have a doping concentration ranges from $1 \times 10^{14}$ cm$^{-3}$ to $1 \times 10^{17}$ cm$^{-3}$. The avalanche diode 310 may include a field plate 326 to shield the electric field of the buried layer 321 from the electric field of the interconnect metal layer 304.

The anode region of the avalanche diode 310 is positioned within the peripheral region 204 and partially extending to the circuit region 202. As such, a part of the anode region is interposed between a contact region 314 in the peripheral region 204 and the buried layer 321 in the circuit region 202. The anode region includes an electrode 312, a contact region 313, a doped region 333, and a portion of the substrate 301 that is interposed between the doped region 333 and the buried layer 321. The electrode 312 is an anode electrode formed as a part of the interconnect metal layer 304, which is positioned on a dielectric layer 303 and a field oxide layer 302. The contact region 313 is an anode contact region that can be formed with a P-doped silicide layer connected to the electrode 312.

The doped region 333 is a P-doped region that extends from the contact region 313 to a doped buried layer 331 and a heavily doped buried layer 332. The doped region 333 has a higher doping concentration of P-type dopants than the semiconductor substrate 301. For instance, the doped region 333 may have a doping concentration ranges from $1\times10^{15}$ cm$^{-3}$ to $1\times10^{21}$] cm$^{-3}$, whereas the semiconductor substrate 301 may have a doping concentration ranges from $5\times10^{13}$ cm$^{-3}$ to $5\times10^{14}$ cm$^{-3}$. Meanwhile, the heavily doped buried layer 332 has a higher doping concentration of N-type dopants than the buried layer 331. For instance, the heavily doped buried layer 332 may have a doping concentration ranges from $1\times10^{18}$ cm$^{-3}$ to $1\times10^{21}$ cm$^{-3}$, whereas the buried layer 331 may have a doping concentration ranges from $1\times10^{14}$ cm$^{-3}$ to $1\times10^{17}$ cm$^{-3}$. The buried layers 331 and 332 may serve as a means for directing the avalanche current of the avalanche diode 310 during an ESD event.

The peripheral structure 232 includes a first contact region 313, a second contact region 314, and a third contact region 315. The first contact region 313 is shared as the anode region of the avalanche diode 310 and as a base region of a bipolar transistor structure (see description of FIG. 3C below). The first contact region 313 and the second contact region 314 have opposite conductivity types. For instance the first contact region 313 can be formed with a P-doped silicide layer, whereas the second contact region 314 can be formed with an N-doped silicide layer. Serving as an emitter region of the bipolar transistor structure, the second contact region 314 is interposed between the first contact region 313 and the buried layer 321, which serves as a collector region of the bipolar transistor structure (see description of FIG. 3C below).

The first contact region 313 and the second contact region 314 are coupled to the electrode 312, which may be coupled to a ground voltage source for discharging an ESD current. The third contact region 315 is floating, and it can be formed with a P-doped silicide. Alternatively, the third contact region 315 may be coupled to the electrode 312 with a similar configuration as the first contact region 313. Each of the first, second, and third contact regions 313, 314, and 315 may form a contiguous ring along and within the peripheral region 204 to laterally surround the circuit region 202. Alternatively, each of the first, second, and third contact regions 313, 314, and 315 may be segmented along and within the peripheral region 204 to form a segmented ring that laterally surrounds the circuit region 202.

The peripheral structure 232 also includes a first doped region 333, a second dope region 334, a doped buried layer 331, a heavily doped buried layer 332. The first doped region 333 is shared as the anode region of the avalanche diode 310 and as the base region of the bipolar transistor structure (see description of FIG. 3C below). In general, the base region of the bipolar transistor structure extends from the first contact region 313 to a portion of the semiconductor substrate 301 that is interposed between the second contact region 314 and the buried layer 321, which is shared as the collector region and as the cathode region of the avalanche diode 310. The second doped region 334 includes P-type dopants and has a higher doping concentration than the semiconductor substrate 301. For instance, the second doped region 334 may have a doping concentration ranges from $1\times10^{15}$ cm$^{-3}$ to $1\times10^{21}$ cm$^{-3}$. The second doped region 334 is interposed between the second contact region 314 and the cathode region of the avalanche diode 310. The second doped region 334, alongside with the buried layers 331 and 332, help guide the avalanche current from the buried layer 321 to the first and second contact regions 313 and 314. By diverting the avalanche current from the buried layer 321 and the PN junction 318, the peripheral structure 232 facilitates a robust snapback response during an ESD event.

For instance, the electrode 311 is configured to receive an ESD voltage (e.g., 1 kV or greater) during an ESD event. The doped region 322 is configured to establish a discharge path between the electrode 311 and the buried layers 321 and 324. When the buried layer 321 incurs a substantial potential build-up (e.g., 700V or greater), the PN junction 318 may experience an avalanche breakdown. To alleviate the potential at the PN junction 318, the peripheral structure 232 provides a snapback mechanism, which direct the avalanche current to flow through the first and second contact regions 313 and 314. Because the electrode 312 is configured to receive a ground supply voltage, which is substantially lower than the potential build-up at the PN junction 318, the second electrode 312 extends the discharge path away from the circuit region 202 via the first and second contact regions 313 and 314. Advantageously, the peripheral structure 232 protects the buried layer 321 from incurring a very high voltage (e.g., more than 1 kV) while discharging a current with very high current density (e.g., about 1 µA/µm).

Referring to FIG. 3B, which shows a cross-sectional view of the driver integrated circuit 200, the peripheral structure 222 is configured to protect a lateral drain metal oxide semiconductor (LDMOS) transistor 350. The LDMOS transistor 350 can be used for implementing either one of the LDMOS transistors 122 and 124 as shown and described in FIG. 1. As a part of an integrated circuit die, the peripheral structure 222 and the LDMOS transistor 350 are formed on the semiconductor substrate 301. One or more buried doped layers (e.g., 361, and 364, 371, 372) may be developed under the top surface 306 of the semiconductor substrate 301. For instance, a buried doped layer (e.g., 361, and 364, 371, 372) may be developed 1 µm below the top surface 306.

In general, the buried doped layer (e.g., 361, and 364, 371, 372) has a second conductivity type that is the opposite of the first conductivity type. For instance, the buried doped layer (e.g., 361, and 364, 371, 372) includes an N-type dopant (e.g., Phosphorous, Arsenic, and/or Antimony) where the semiconductor substrate 301 includes a P-type dopant (e.g., Boron). Conversely, the buried doped layer (e.g., 361, and 364, 371, 372) includes a P-type dopant where the semiconductor substrate 301 includes an N-type dopant. As such, the buried doped layer (e.g., 361, and 364, 371, 372) and the semiconductor substrate 301 create one or more PN junctions that may experience avalanche breakdowns during an ESD event. The buried doped layer (e.g., 361, and 364, 371, 372) can be developed by epitaxial growth or by deep ion implantation. For efficiency, the buried doped layer (e.g., 361, and 364, 371, 372) may be formed with the same process steps as the buried doped layer (e.g., 361, and 364, 371, 372) as shown and described in FIG. 3A.

The LDMOS transistor 350 is positioned within the circuit region 202 and adjacent to the peripheral structure 222. The LDMOS transistor 350 has a drain region (e.g., 356, 362, 263), a lateral drain (drain extended) region 361, a source region 358, a RESURF region 376, and a body region. In general, the drain region (e.g., 356, 362, 263), the lateral drain (drain extended) region 361, and the source region 358 include N-type dopants, whereas the RESURF region 376 and the body region 375 includes P-type dopants. Positioned within the circuit region 202, the drain region of the LDMOS transistor 350 includes an electrode 351, a contact region 356, a doped region 362, and optionally a heavily doped region 363. The lateral drain region includes a doped buried layer 361, optionally a heavily doped buried layer 364, and a doped region 365. The electrode 351 is a drain electrode formed as a part of the interconnect metal layer 304, which is positioned on the dielectric layer 303 and the field oxide layer 302. The contact region 356 is a drain contact region that can be formed with an N-doped silicide layer connected to the electrode 351.

The doped region 362 is an N-doped region that extends from the contact region 356 to the buried layer 361 and the heavily doped buried layer 364. The heavily doped buried layer 364 has a higher doping concentration of N-type dopants than the buried layer 361. For instance, the heavily doped buried layer 364 may have a doping concentration ranges from $1\times10^{18}$ cm$^{-3}$ to $1\times10^{21}$ cm$^{-3}$, whereas the buried layer 361 may have a doping concentration ranges from $1\times10^{14}$ cm$^{-3}$ to $1\times10^{17}$ cm$^{-3}$. To enhance the breakdown characteristic of the LDMOS transistor 350, the buried layer 361 may serve as a lateral drain drift (or drain extended) region of the heavily doped buried layer 364.

The heavily doped region 363 has a higher doping concentration of N-type dopants than the doped region 362 for reducing the resistance between the contact region 356 and the buried layers 361 and 364. For instance, the heavily doped region 363 may have a doping concentration ranges from $1\times10^{18}$ cm$^{-3}$ to $1\times10^{21}$ cm$^{-3}$, whereas the doped region 362 may have a doping concentration ranges from $1\times10^{14}$ cm$^{-3}$ to $1\times10^{17}$ cm$^{-3}$. The LDMOS transistor 350 may include field plates 366 and 368 to shield the electric field of the drain region and lateral drain region from the electric field of the interconnect metal layer 304.

Positioned between the peripheral structure 222 and the drain contact region 356, the source region of the LDMOS transistor 350 includes an electrode 352 and a contact region 358. The electrode 352 is a source electrode formed as a part of the interconnect metal layer 304. The contact region 358 is a source contact region that can be formed with an N-doped silicide layer connected to the electrode 352. The source contact region 358 is laterally surrounded by the doped region 365, which is extended from the buried layer 361 positioned thereunder. The LDMOS transistor 350 also includes a gate electrode 367 that is positioned above the top surface 306 and across a channel region between the source contact region 358 and the doped region 365. When the gate electrode 367 carries a voltage sufficient to deplete the channel region, the source contact region 358 will conduct a current from the buried layer 361 to the source electrode 352, which can be connected to a ground voltage source.

During an ESD event, the source electrode 352 may discharge all or a portion of the ESD current. When a substantial amount of the ESD current is not discharged by the source electrode 352, the potential of the buried layer 361 will begin to build up. At a certain threshold, the potential of the buried layer 361 is high enough to initiate an avalanche breakdown at a PN junction 359, which leads to the generation of an avalanche current. The peripheral structure 222 provides a mechanism to divert the avalanche current while preventing the potential of the buried layer 361 from exceeding a safe area of operation.

Similar to the peripheral structure 232, the peripheral structure 222 includes a first contact region 353, a second contact region 354, and a third contact region 355. The first contact region 353 serves as a base region of a bipolar transistor structure, whereas the second contact region 354 serves as an emitter region of the bipolar transistor structure (see description of FIG. 3C below). The first contact region 353 and the second contact region 354 have opposite conductivity types. For instance the first contact region 353 can be formed with a P-doped silicide layer, whereas the second contact region 354 can be formed with an N-doped silicide layer. Serving as the emitter region of the bipolar transistor structure, the second contact region 354 is interposed between the first contact region 353 and the buried layer 361, which serves as a collector region of the bipolar transistor structure (see description of FIG. 3C below) in addition to serving as a lateral drain drift region of the LDMOS transistor 350.

The first contact region 353 and the second contact region 354 are coupled to the electrode 357, which may be coupled to a ground voltage source for discharging an ESD current. The third contact region 355 is floating, and it can be formed with a P-doped silicide. Alternatively, the third contact region 355 may be coupled to the electrode 357 with a similar configuration as the first contact region 353. Each of the first, second, and third contact regions 353, 354, and 355 may form a contiguous ring along and within the peripheral region 204 to laterally surround the circuit region 202.

In one implementation, for example, the first contact region 333 of the peripheral structure 232 and the first contact region 353 of the peripheral structure 222 can be connected to each other to form a first contiguous ring. In another implementation, for example, the second contact region 334 of the peripheral structure 232 and the second contact region 354 of the peripheral structure 222 can be connected to each other to form a second contiguous ring. In yet another implementation, for example, the third contact region 335 of the peripheral structure 232 and the third contact region 355 of the peripheral structure 222 can be connected to each other to form a third contiguous ring. Alternatively, each of the first, second, and third contact regions 353, 354, and 355 may be segmented along and within the peripheral region 204 to form a segmented ring that laterally surrounds the circuit region 202.

The peripheral structure 222 also includes a first doped region 373, a second dope region 374, a doped buried layer 371, and a heavily doped buried layer 372. The first doped region 373 serves as the base region of the bipolar transistor structure (see description of FIG. 3C below). The first and second doped regions 373 and 374 each includes a P-type dopant and has a higher doping concentration than the semiconductor substrate 301. For instance, the first and second doped regions 373 and 374 each may have a doping concentration ranges from $1\times10^{15}$ cm$^{-3}$ to $1\times10^{21}$ cm$^{-3}$.

In general, the base region of the bipolar transistor structure extends from the first contact region 353 to a portion of the semiconductor substrate 301 that is interposed between the second contact region 354 and the buried layer 361. The second doped region 374 is interposed between the second contact region 354 and buried layer 361 (i.e., the lateral drain drift region 361 of the LDMOS transistor 350). The second doped region 374, alongside with the buried layers 371 and 372, help guide the avalanche current from the buried layer 361 to the first and second contact regions 353 and 354. By diverting the avalanche current from the buried layer 361 and the PN junction 359, the peripheral structure 222 facilitates a robust snapback response during an ESD event.

For instance, the electrode 351 is configured to receive an ESD voltage (e.g., 1 kV or greater) during an ESD event. The doped region 362 is configured to establish a discharge path between the electrode 351 and the buried layers 361 and 364. When the buried layer 361 incurs a substantial potential build-up (e.g., 700V or greater), the PN junction 359 may experience an avalanche breakdown. To alleviate the potential at the PN junction 359, the peripheral structure 222 provides a snapback mechanism, which direct the avalanche current to flow through the first and second contact regions 353 and 354. Because the electrode 357 is configured to receive a ground supply voltage, which is substantially lower than the potential build-up at the PN junction 359, the second electrode 357 extends the discharge path away from the circuit region 202 via the first and second contact regions 353 and 354. Advantageously, the peripheral structure 222 protects the buried layer 361 from incurring a very high voltage (e.g., more than 1 kV) while discharging a current with very high current density (e.g., about 1 μA/μm).

Figure 3C:
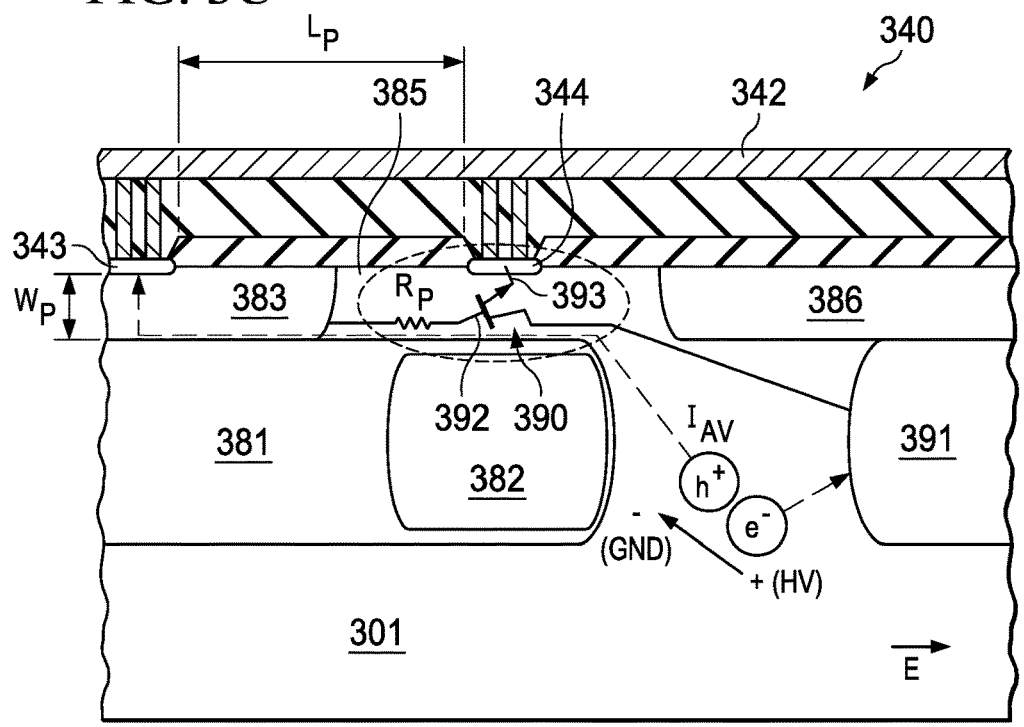

FIG. 3C show a cross-sectional view of a peripheral structure 340 to illustrate the snapback mechanism as discussed in FIGS. 3A and 3B. Similar to the peripheral structures 222 and 232, the peripheral structure 340 includes a P+ contact region 343, an N+ contact region 344, a first P-doped region 383, a second P-doped region 386, an N-doped buried layer 381, and an N+ buried layer 382. Theses structural components of the peripheral structure 340 help define a bipolar transistor structure 390 for providing snapback protection to the circuit region 202 during an ESD event. The bipolar transistor structure 390 partially resides within the peripheral region 204 to form an ESD guard ring that circumscribes the circuit region 204.

The bipolar transistor structure 390 includes a collector region 391, a base region 392, and an emitter region 393. The emitter region 393 includes the N+ contact region 344. The collector region 391 includes a buried layer within the circuit region 202, such as the buried layer 361 (i.e., the lateral drain drift region of the LDMOS transistor 350) or the buried layer 321 (i.e., the cathode region of the avalanche diode 310). The base region 392 includes the first contact region 343, the first doped region 383, a pinch resistance region 385, and a part of the substrate 301 that is interposed between the N+ contact region 344 and the cathode region 391.

The pinch resistance region 385 includes a P-type dopant, and it is positioned under the second contact region 344 and between the first and second doped regions 343 and 344. Moreover, the pinch resistance region 385 has pinch resistance $R_P$ that is proportional to a length $L_P$ of the pinch resistance region 385 and inversely proportional to a width $W_P$ of the pinch resistance region 385. The length $L_P$ is defined by a distance between the P+ contact region 343 and the N+ contact region 344. The width $W_P$ is defined be a distance between the N+ contact region 344 and the buried layers 381 and 382.

During an ESD event, the collector region 391 may experience a potential build-up. When the PN junction between the collector region 391 and the base region 392 exceeds a PN-junction breakdown voltage (e.g., greater than 700V), electron-hole pairs are created to generate an avalanche current $I_{AV}$. Initially, the avalanche current $I_{AV}$ flows toward the P+ contact region 343 to reach the ground voltage source via the ground electrode 342. Because of the pinch resistance $R_P$, the potential of the pinch resistance region 385 near the emitter region 393 begins to rise as the amount of the avalanche current $I_{AV}$ increases. When the potential of the pinch resistance region 385 is sufficiently high to create a forward bias with the N+ contact region 344, the avalanche current $I_{AV}$ will flow from the base region 392 to the emitter region 393. By diverting the avalanche current $I_{AV}$ from the collector region 391 (i.e., the buried layers 321 and/or 361), the bipolar transistor structure 390 reduces the potential of the collector region 391 even when an increasing amount of ESD current is flowing through the collector region 391. To that end, the bipolar transistor structure 390 provides a snapback protection to the circuit region 202. Advantageously, the circuit region 202 may operate within a safe operation area (SOA) while meeting a certain HBM ESD standard (e.g., 1 kV to 2 kV).

For a robust snapback response, the pinch resistance $R_P$ can be set at a relatively large value, such that a small amount avalanche current $I_{AV}$ may cause the potential of the pinch resistance region 385 to rise substantially and quickly. In one implementation, for example, the pinch resistance $R_P$ may be configured by having the length $L_P$ and the width $W_P$ at a ratio that is equal to or greater than 8. In another implementation, for example, the pinch resistance $R_P$ may be configured by having the length $L_P$ and the width $W_P$ at a ratio that is equal to or greater than 20.

Figure 4:
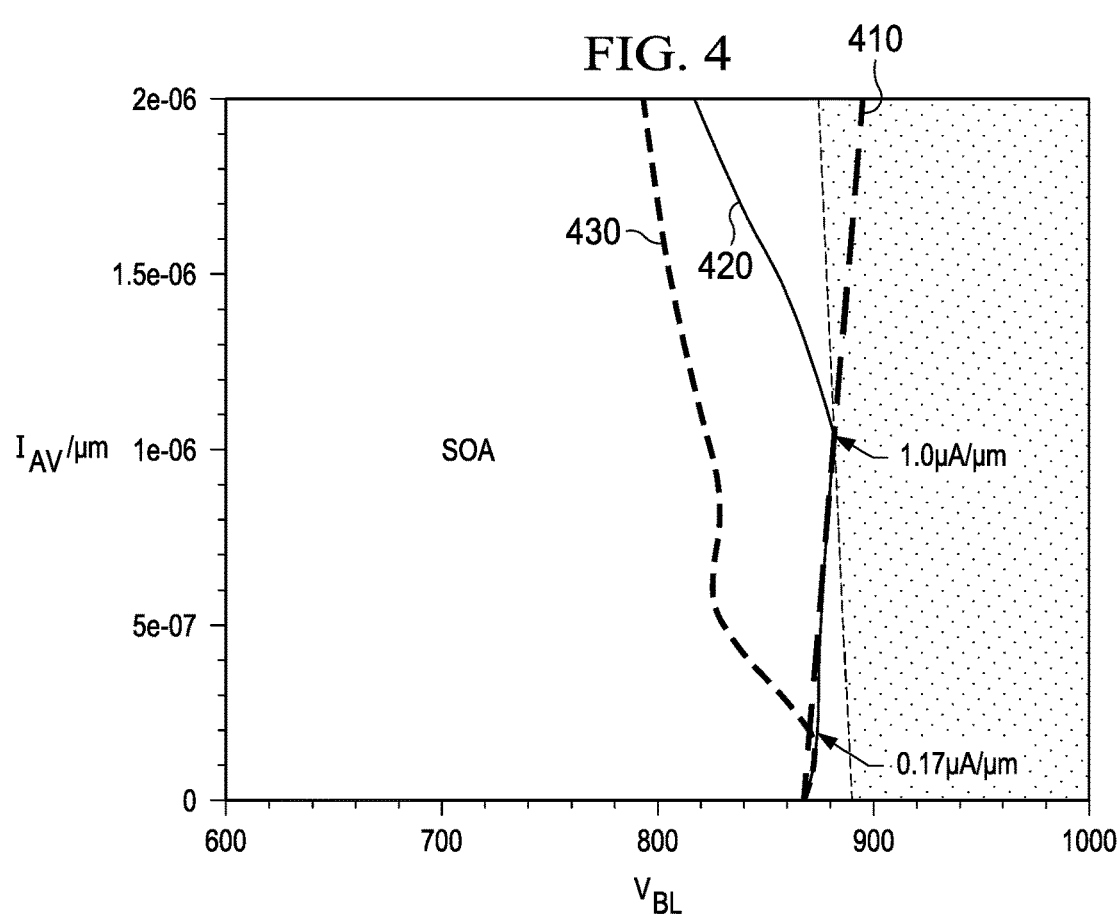
FIG. 4 shows a current-voltage (IV) diagram illustrating the snapback currents conducted by the peripheral structure according to an aspect of the present disclosure.

Referring to FIG. 4, several current-voltage (IV) curves are shown to demonstrate the effects of snapback protections. A first IV curve 410 illustrates the current-voltage characteristics of a first ESD device with no snapback response. With no snapback response, the buried layer voltage $V_{BL}$ of the first device continues to rise with an increasing amount of avalanche current $I_{AV}$ density, thereby bringing the first device outside of the safe operation area SOA.

A second IV curve 420 illustrates the current-voltage characteristics of a second ESD device with a slow snapback response. With the slow snapback response, the buried layer voltage $V_{BL}$ of the second ESD device continues to rise with an increasing amount of avalanche current $I_{AV}$ density until the avalanche current $I_{AV}$ density reaches 1.0 μA/μm. And at that point, the buried layer voltage $V_{BL}$ of the second ESD device begins to drop, thereby keeping the second ESD device within the safe operation area SOA.

A third IV curve 430 illustrates the current-voltage characteristics of a third ESD device with a fast snapback response. With the fast snapback response, the buried layer voltage $V_{BL}$ of the third ESD device begins to drop as soon as the amount of avalanche current $I_{AV}$ density reaches 0.17 μA/μm. Advantageously, the third ESD device is kept within the safe operation area SOA starting from an early stage of an ESD event.

Figure 5B:
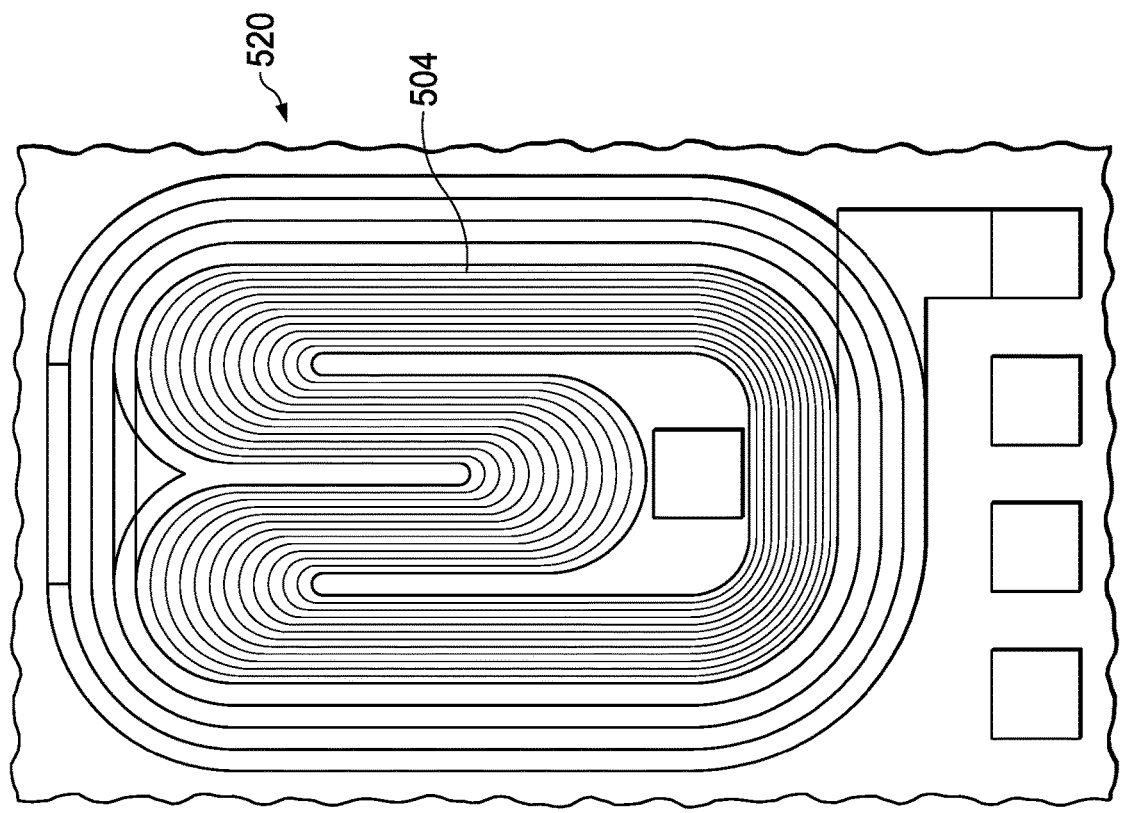
FIG. 5B shows a top exposed view of another electrostatic discharge (ESD) device according to another aspect of the present disclosure.
Figure 5A:
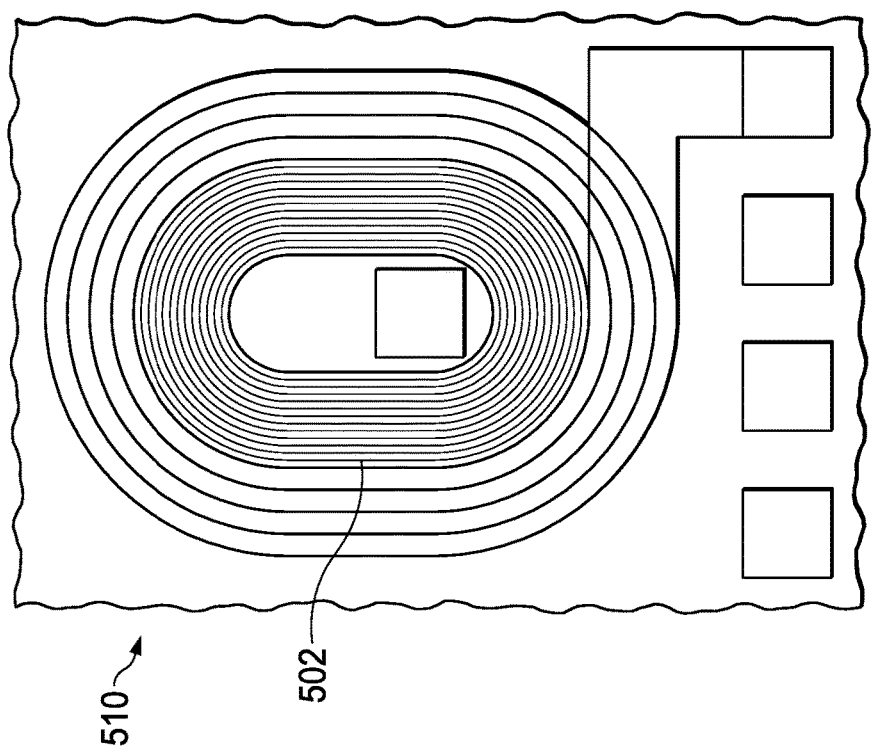
FIG. 5A shows a top exposed view of an electrostatic discharge (ESD) device according to an aspect of the present disclosure.

The disclosed ESD protection structures (e.g., the peripheral structures 222, 224, 232, 234, and 340) can be applied to protect a wide range of high voltage (e.g., operation voltage that is greater than 700V) circuitries and circuit components aside from the driver integrated circuits 100 and 200. The disclosed ESD protection structures may also adopt various peripheral shapes and configurations. As shown in FIG. 5A, in one example, an ESD guard ring 502 having a race track profile can be used for protecting a high voltage device 510. And as shown in FIG. 5B, in another example, an ESD guard ring 504 having a multi-finger profile can be used for protecting a high voltage device 520.

Figure 6:
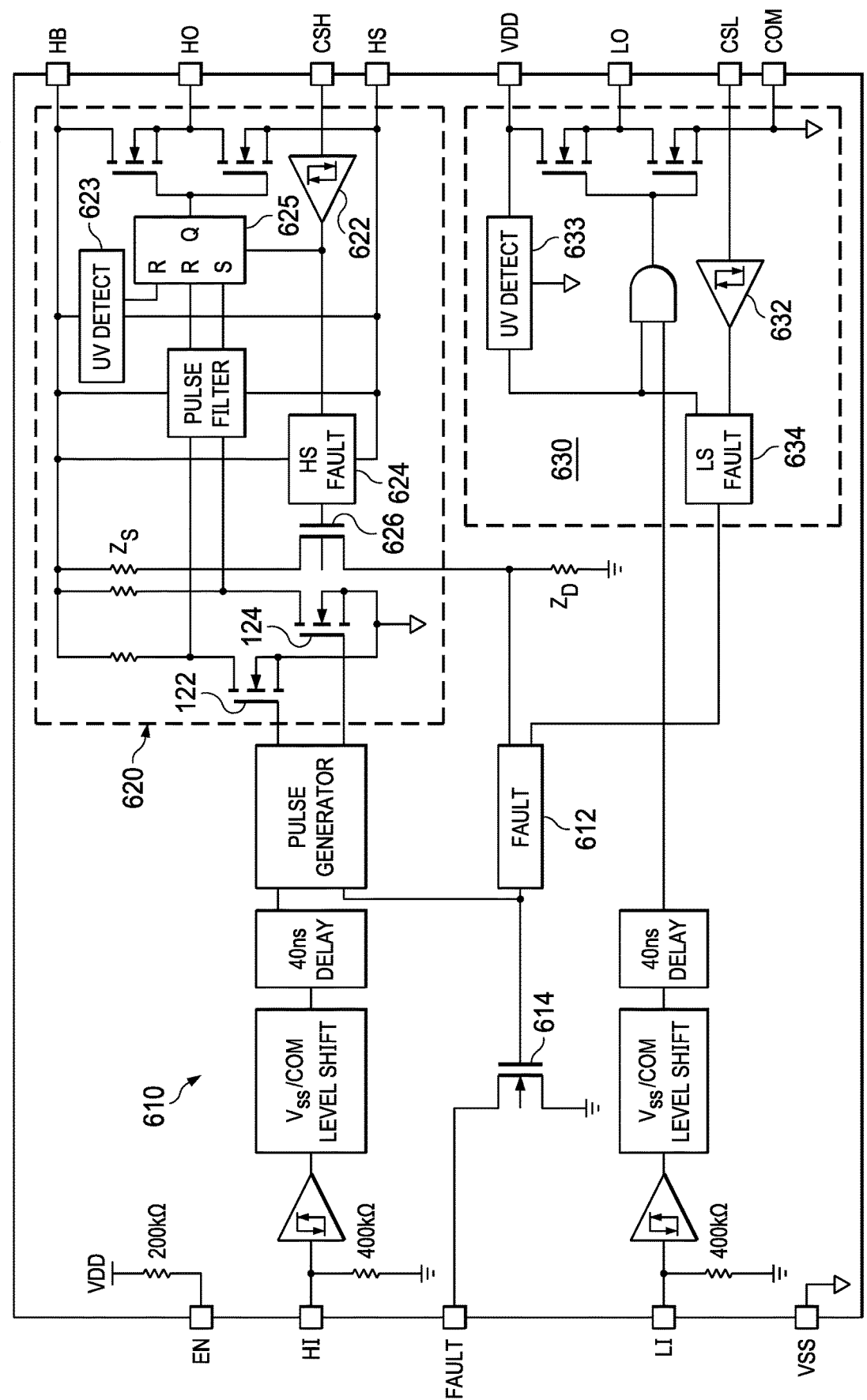
FIG. 6 shows a schematic view of a driver integrated circuit with overcurrent fault detection according to an aspect of the present disclosure.

While the driver integrated circuits 100 and 200 each include two or more LDMOS transistors (e.g., 122, 124, 222, 224, and/or 350), each of which serve the function of level up shifting, these circuits 100 and 200 may benefit from having one or more transistors for level down shifting as well. One application of level down shifting includes overcurrent fault detection and feedback. For example, FIG. 6 shows a schematic view of a driver integrated circuit 600 with overcurrent fault detection according to an aspect of the present disclosure. Like the driver integrated circuit 100, the driver integrated circuit 600 includes a low voltage control circuit (LVC) 610, a high side gate driver (HSGD) 620, and a low side gate driver (LSGD) 630. The respective configurations and functions of each of the LVC 610, the HSGD 620, and the LSGD 630 are substantially the same as their counterparts as shown and described in FIG. 1.

Moreover, each of the LVC 610, the HSGD 620, and the LSGD 630 includes additional circuit components for detecting and responding to overcurrent faults. The LSGD 630 includes a Schmitt trigger 632, an under voltage (UV) detect circuit 633, and a low side (LS) fault circuit 634. The Schmitt trigger 632 has an input coupled to a low side current sensing (CSL) pad for receiving a signal that indicates a current overflow from the low side switch. The Schmitt trigger 632 generates an output signal when the CSL signal passes a certain threshold. The UV detect circuit 633 is responsible for detecting a drop of the supply voltage VDD, and it generates an output signal when the supply voltage is below a certain threshold. The LS fault circuit 634 generates an output signal upon detecting an output signal from either one of the Schmitt trigger 632 or the UV detect circuit 633.

For fault detection, the HSGD 620 includes a Schmitt trigger 622, a high side (HS) fault circuit 624, a p-channel transistor 626, and an under voltage (UV) detect circuit 623. The Schmitt trigger 622 has an input coupled to a high side current sensing (CSH) pad for receiving a signal that indicates a current overflow from the high side switch. The Schmitt trigger 622 generates an output signal when the CSH signal passes a certain threshold. The UV detect circuit 623 is responsible for detecting a drop of the supply voltage at the HB pad, and it generates an output signal when the supply voltage is below a certain threshold. The output signal is fed into a reset input port of an SR flip flop 625, as well as the HS fault circuit 624. The HS fault circuit 624 generates an output signal upon detecting an output signal from either one of the Schmitt trigger 622 or the UV detect circuit 623. The output signal of the HS fault circuit 624 drives a gate terminal of the p-channel transistor 626, which has a source terminal coupled to the HB pad via a source impedance $Z_S$, and a drain terminal coupled to a ground source via a drain impedance $Z_D$.

Figure 7:
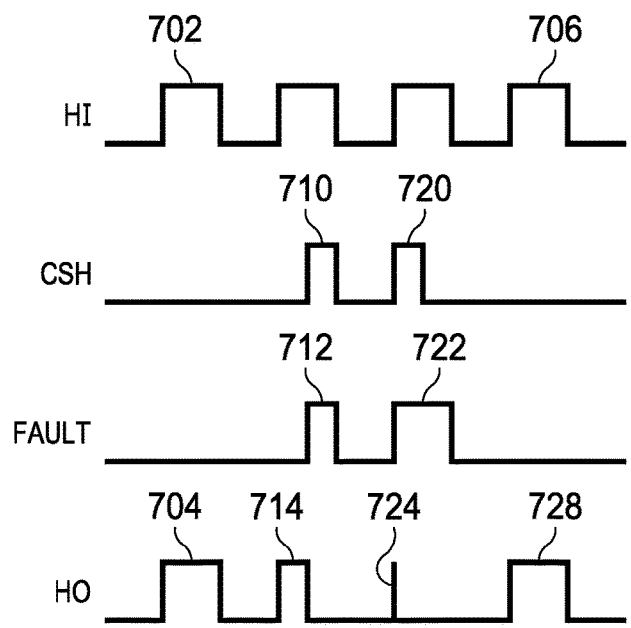
FIG. 7 shows a timing diagram of various signals for overcurrent fault detection according to an aspect of the present disclosure.

When the output signal of the HS fault circuit 624 is sufficiently low in comparison with the voltage at the HB pad, the p-channel transistor 626 begins conducting, thereby developing a voltage across the drain impedance $Z_D$. The drain voltage of the p-channel transistor 626 is fed into the fault circuit 612, which generates an output signal FAULT that drives the gate terminal of an n-channel transistor 614 and a pulse generator. As shown in FIG. 7, the FAULT signal has rising edges 712 and 722 that follow the rising edges 710 and 720 of the CSH signal. This is because the p-channel transistor 626 becomes conductive when the CSH signal is high, which causes the drain voltage of the p-channel transistor 626 to rise and drive the fault circuit 612 to generate a high FAULT signal.

When the FAULT signal is low, the high side output signal HO follows the duty cycle of the high side input signal HI. For example, the high side output signal HO has rising edges 704 and 708 that follow the rising edges 702 and 706 of the high side input signal HI. When the FAULT signal is high, the high side output signal HO is decoupled from the high side input signal HI. As such, the high side output signal HO has falling edges 714 and 724 that follow the rising edges 712 and 722 of the FAULT signal. As long as the FAULT signal stays high, the high side output signal HO remains low and decoupled from the high side input signal HI. Hence, the high side output signal HO is level shifted down by the open drain configuration of the p-channel transistor 626, which serves as a trigger device for level-down shifting the HSGD 620.

The formation of the p-channel transistor 626 typically involves processing one or more n-type epitaxial layer and the p-type substrate in addition to the process steps for forming the n-channel LDMOS transistors (e.g., 122, 124, 222, 224, and/or 350). Moreover, the p-channel transistor 626 may take up additional area inside of the circuit region 202. As such, the p-channel transistor 626 may have couplings with the HB pad and the ground terminal that result in direct wire bonding inside of the driver integrated circuit die 600.

Figure 8:
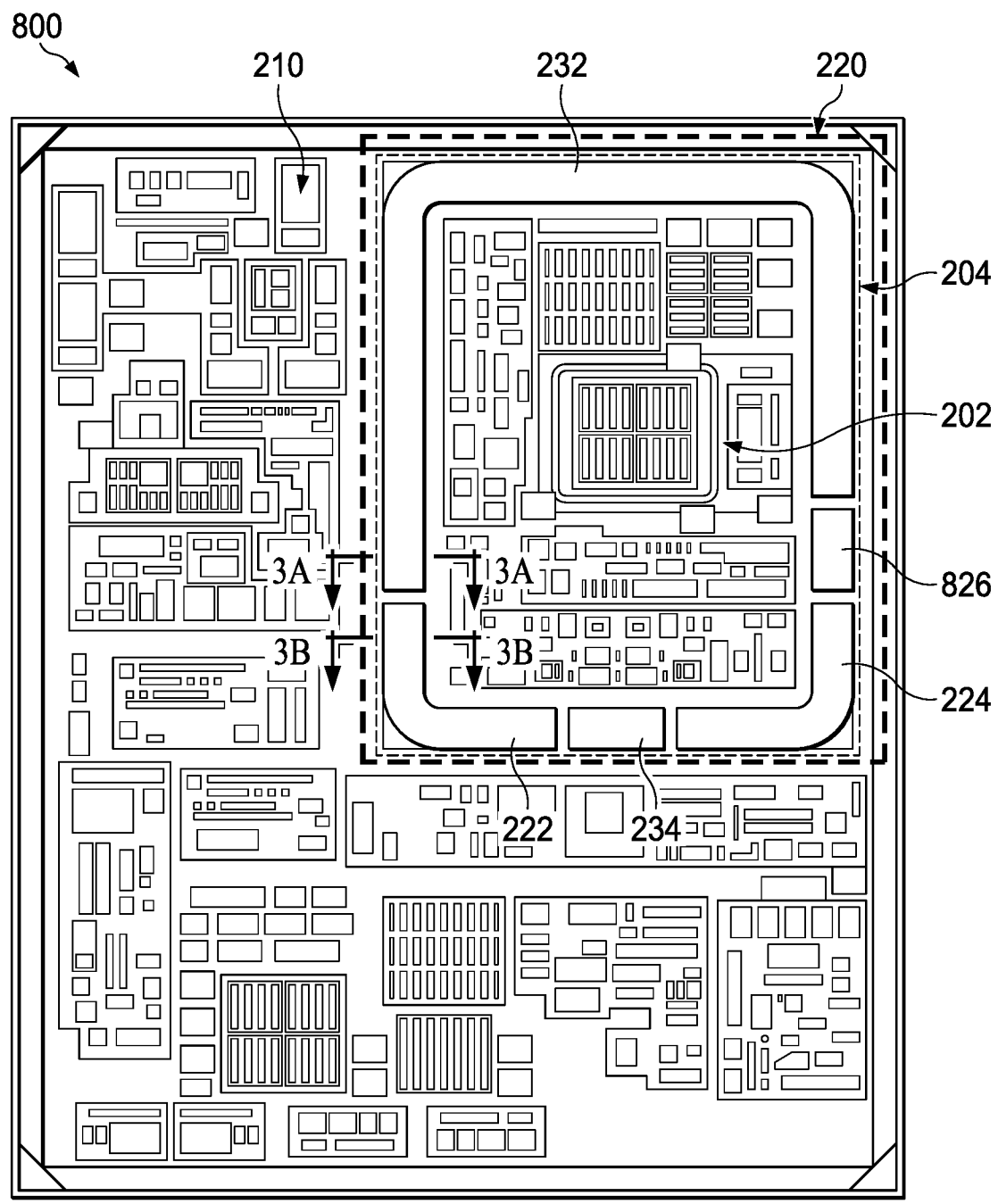
FIG. 8 shows a top exposed view of a driver integrated circuit with overcurrent fault detection according to an aspect of the present disclosure.

The present disclosure introduces a scheme in which one or more p-channel transistors are integrated into a high voltage junction termination area (e.g., the peripheral region 204) alongside with the n-channel transistors (e.g., LDMOS 222, 224, and/or 350) and the high voltage junction diodes (e.g., the avalanche diode 232, 234 and/or 310). As shown in FIG. 8, for example, a driver integrated circuit 800 can be used for implementing the schematic configuration of the driver integrated circuit 200. The layout of the driver integrated circuit 800 is substantially the same as that of the driver integrated circuit 200 except for an additional p-channel transistor 826. Although the driver integrated circuit 800 can be used for implementing the schematic configuration of the driver integrated circuit 200, the driver integrated circuit 800 is not limited by such a schematic configuration. As such, the layout of the driver integrated circuit 800 can be adopted by other circuit configurations that include a p-channel device with features and characteristics similar to those of the p-channel transistor 826.

The p-channel transistor 826 is integrated alongside with the LDMOS transistors 222 and 224 (see also the LDMOS transistor 350), the diodes 232 and 234 (see also the diode 310), and the peripheral NPN structure (e.g., 340) across the circuit region 202 and the peripheral region 204. In one configuration, for example, the p-channel transistor 826 may be positioned between the LDMOS transistor 224 and the junction diode 232. Together, the p-channel transistor 826, the n-channel LDMOS transistors 222 and 224 (see also the LDMOS transistor 350), the diodes 232 and 234 (see also the diode 310), and the peripheral NPN structure (see, e.g., supra, 340) form an ESD guard ring that circumscribes the circuit region 202 and segregates the circuit region 202 from the peripheral region 204. Because of this integration, the fabrication of the p-channel transistor 826 does not require additional processes that are different from the fabrication process of the LDMOS transistors 222 and 224. Nor does the fabrication of the p-channel transistor 826 require additional area in the circuit region 202 because the p-channel transistor 826 is embedded in the ESD guard ring alongside with the diodes 232 and 234, and the LDMOS transistors 224 and 222. Advantageously, the present disclosure provides a low-cost, process-efficient, and area-efficient solution to enable down-level shifting in a high voltage circuit.

Figure 9:
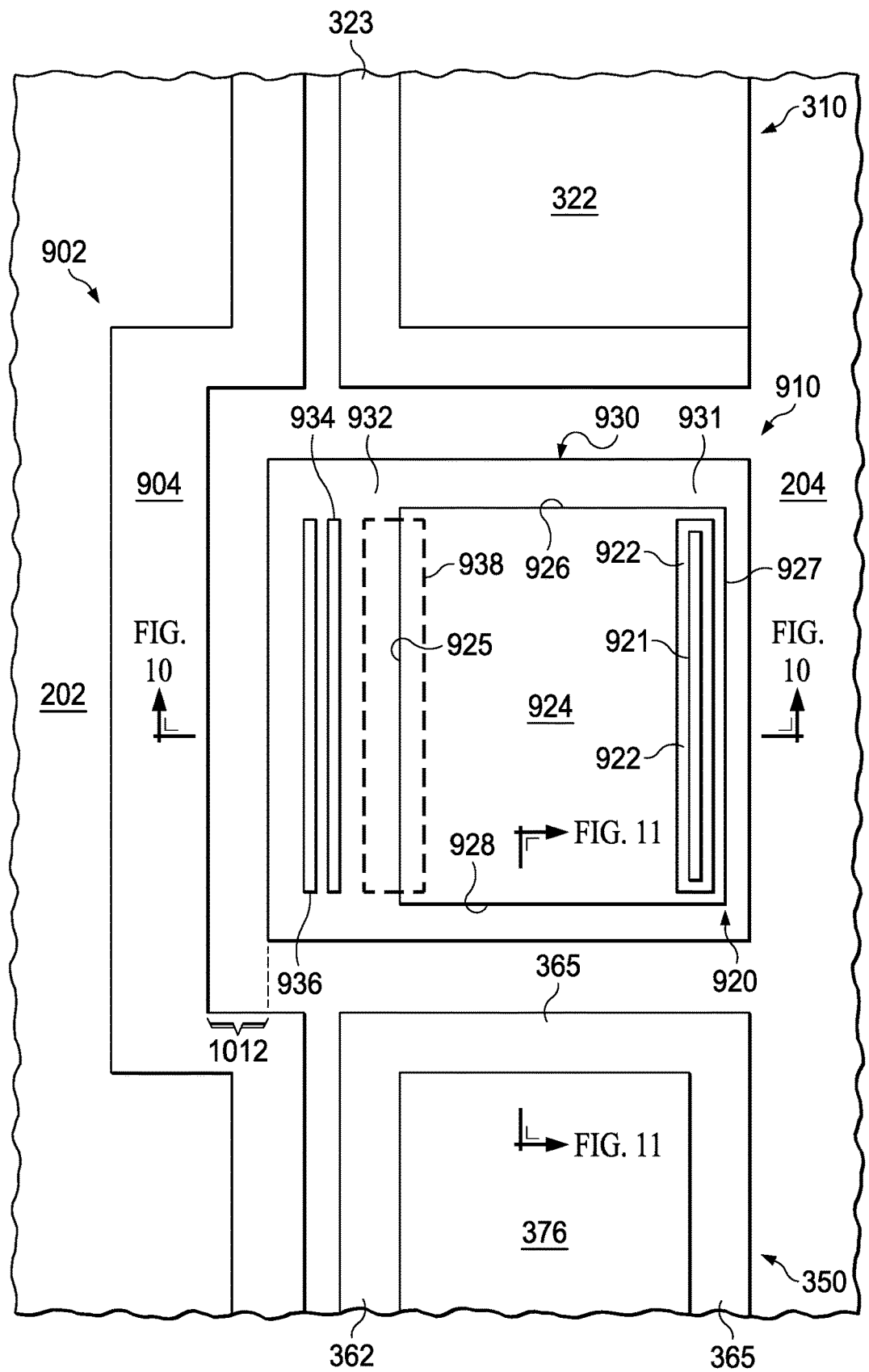
FIG. 9 shows a partially enlarged top exposed view of the driver integrated circuit with overcurrent fault detection according to an aspect of the present disclosure.

FIG. 9 shows a partially enlarged top exposed view of an exemplary configuration that implements the driver integrated circuit 800. As described in FIGS. 3A-3B, the LDMOS transistor 350 can be used for implementing the LDMOS 224, whereas the diode 310 can be used for implementing the diode 232. Moreover, a drain extended PMOS (P-DEMOS) transistor 910 can be used for implementing the p-channel transistor 826. As a part of the ESD guard ring, a doped barrier structure 902 is positioned between a first circuit region (e.g., the circuit region 202) and a second circuit region (e.g., the peripheral region 204). The doped barrier structure 902 can be a contiguous ring structure circumscribing the first circuit region within an inner track of the ESD guard ring. Alternatively, the doped barrier structure 902 can be a segmented ring structure circumscribing the first circuit region, and it includes segments adjacent to each of the circuit components (e.g., 310, 910, 350) in the second circuit region. The conductivity type of the doped barrier structure 902 is chosen to isolate the high voltage operations in the first circuit region from reaching the second circuit region. In one implementation, for example, the doped barrier structure 902 is doped with n-type dopants where it is surrounded by the p-doped substrate (e.g., supra, substrate 301 in FIGS. 3A-3C).

The doped barrier structure 902 has a notch portion 904 with an opening facing away from the first circuit region. The P-DEMOS transistor 910 is positioned partially within the notch portion 904. In a configuration where the doped barrier structure 902 merges with the n-doped regions of the diode 310 and the LDMOS transistor 350, the notch portion 904 extends toward the second circuit region, such that the P-DEMOS transistor 910 may be positioned completely within the notch portion 904.

The P-DEMOS transistor 910 includes a first doped region 920 of a first conductivity type and a second doped region 930 of a second conductivity type opposite to the first conductivity type. In a first configuration where the first doped region 920 serves as a drain region while the second doped region 930 serves as a body-barrier region, the first conductivity type is p-type and the second conductivity type is n-type. Alternatively, in a second configuration where the first doped region 920 serves as a RESURF region while the second doped region 930 serves as a drain region, the first conductivity type is n-type and the second conductivity type is p-type. The discussion below will focus primarily on the first configuration.

Serving as the drain region of the P-DEMOS transistor 910, the p-doped region 920 extends along a channel length dimension between a first end 925 and a second end 927, and it extends along a channel width dimension between a first side 926 and a second side 928. In a configuration where the width of the p-doped region 920 is relatively large compared to the length thereof (e.g., W-to-L ration ≥1), the first end 925 and the second end 927 may be referred to a first end side 925 and a second end side 927 respectively. Under this reference, the first end side 925 is parallel to the second end side 927, and they are each perpendicular to the first side 926 and the second side 928 to form a rectangular shape.

The drain region as implemented within the p-doped region 920 also includes a drain contact region 921, a heavily doped drain region 922, and a lightly doped drain region 924. Positioned within the heavily doped drain region 922, the drain contact region 921 is p-doped and it is coupled to a drain electrode (see, infra, FIG. 10). The heavily doped drain region 922 is likewise p-doped, and it is positioned near the second end 927 of the p-doped region 920. The lightly doped drain region 924 occupies a majority of the p-doped region 920, and it serves as a drain extended region for performing drain-drifting functions.

In general, the lightly doped drain region 924 has a lower average dopant concentration than the heavily doped drain region 922. For example, the lightly doped drain region 924 may have an average dopant concentration ranging from $1\times10^{14}$ cm$^{-3}$ to $1\times10^{16}$ cm$^{-3}$, whereas the highly doped drain region 922 may have an average dopant concentration ranging from $1\times10^{17}$ cm$^{-3}$ to $1\times10^{19}$ cm$^{-3}$. Moreover, the lightly doped drain region 924 has a greater length along the channel length dimension (e.g., a direction parallel to the first side 926 and/or the second side 928) than the heavily doped drain region 922. For example, the lightly doped drain region 924 may have a first length ranging from 20 μm to 200 μm, whereas the highly doped drain region 922 may have a second length ranging from 2 μm to 20 μm.

Serving as the body region and barrier region of the P-DEMOS transistor 910, the second doped region 930 is n-doped, and it circumscribes the first doped region 920 along the first end 925 and the second end 927 as well as the first side 926 and the second side 928. The second doped region 930 can be partitioned into the body region 932 and the barrier region 931. The body region 932 interfaces the first end side 925 of the rectangular shaped first doped (e.g., drain) region 920. The barrier region 931 interfaces the second end side 927 as well as the first and second sides 926 and 928 of the rectangular shaped first doped (e.g., drain) region 920. Together, the barrier region 931 and the body region 932 form an n-doped ring structure to laterally enclose the first doped (e.g., drain) region 920.

A source contact region 934 is positioned in the body region 932, and it is separated from the first doped (e.g., drain) region 920 by the body region 932 near the first end side 925. The source contact region 934 is p-doped, and it is coupled to a source electrode (see, infra, FIG. 10). A body contact region 936 is positioned next to the source contact region 934. The body contact region 936 is n-doped, and it is coupled to a body electrode (see, infra, FIG. 10), which may also be coupled to the source electrode. A gate structure 938 is positioned above and across the first doped (e.g., drain) region 920 and the second doped (e.g., body) region 932. The gate structure 938 is coupled to a gate electrode (see, infra, FIG. 10), which may be driven by the high side fault circuit 624, the Schmitt trigger 622, and/or the CSH signal received from the CSH pad as described in FIG. 6.

Figure 10:
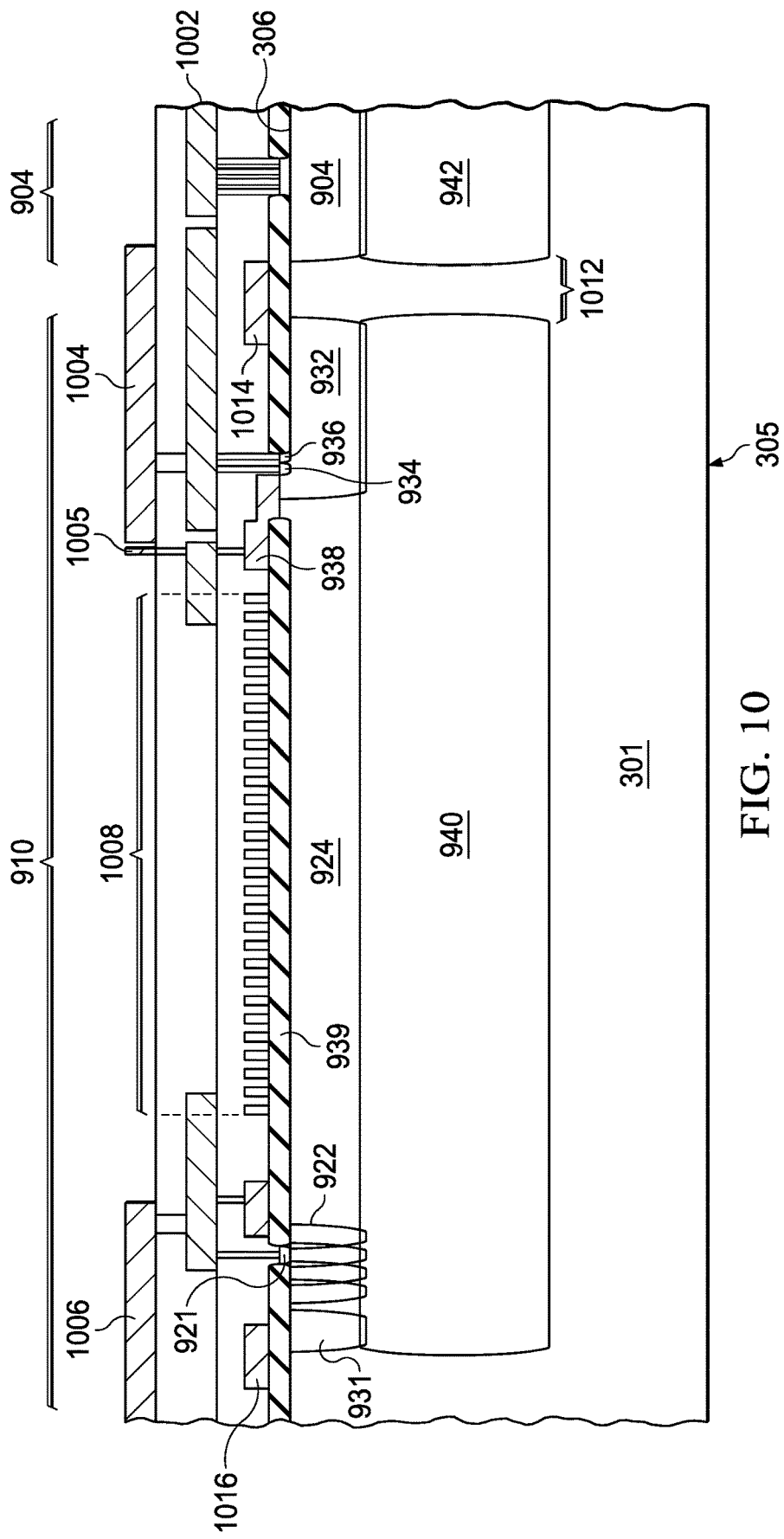
FIG. 10 shows a partial longitudinal cross-sectional view of a p-channel device according to an aspect of the present disclosure.

FIG. 10 shows a partial cross-sectional view along a channel length direction of the P-DEMOS transistor 910. The P-DEMOS transistor 910 is developed from the substrate 301 having a bottom surface 305 and a top surface 306. As described in FIG. 9, the P-DEMOS transistor 910 has a drain region (e.g., 922 and 924) extending from the top surface 306. The drain contact region 921 is positioned within the highly doped drain region 922, and it also extends from the top surface 306. The drain contact region 921 is coupled to a drain electrode 1006, which is coupled to a ground terminal via a drain impedance element, such as a resistor. The drain contact region 921 may have a higher average dopant concentration than the highly doped drain region 922, which in turn has a higher average dopant concentration than the lightly doped drain region 924. The lightly doped drain region 924 extends between the highly doped drain region 922 and the drain contact region 921 on the one hand, and the body region 932 and the source contact region 934 on the other hand. When the P-DEMOS transistor 910 becomes conductive, the lightly doped drain region 924 serves as a drain extended region that performs the function of drain drifting.

The P-DEMOS transistor 910 has a doped layer 940 buried under the top surface 306 and above the bottom surface 305. The doped layer 940 serves the functions of reducing the surface field tension of the drain regions 922 and 924, as well as isolating the P-DEMOS transistor 910 from the substrate 301. The doped layer 940 has the same conductivity type as the body region 932 and the barrier region 931. In one configuration, for example, the doped layer 940 is n-doped. The body region 932 and the barrier region 931 each extends from the top surface 306 downward to reach the doped layer 940. The doped layer 940 interfaces with the body region 932 and the barrier region 931 to form an n-doped tank structure, within which the p-doped drain regions 922 and 924 are fitted.

The source contact region 934 and the body contact region 936 each extends from the top surface 306 and is positioned within the body region 932. The source contact region 934 is coupled to a source electrode 1004, which may also serve as a body electrode for it is coupled to the body contact region 936 as well. The source electrode 1004 is coupled to an HB electrode 1002 via a source impedance element, such as a resistor. The HB electrode 1002 is coupled to the notch portion 904 (which is an n-doped region like the body region 932) and the buried layer 942 (which is an n-doped buried layer like the RESURF layer 940).

As a part of the ESD guard ring integration process, the n-doped buried layers 940 and 942 can be formed under a first set of same process steps, whereas the n-doped regions 931, 932, and 904 can be formed under a second set of same process steps. Advantageously, this integration process allows the fabrication of the P-DEMOS transistor 910 to be process efficient because no additional process steps are required to form the P-DEMOS transistor 910 within the substrate 301 other than the existing process steps for forming the doped region 904 and the doped layer 942.

To insulate the HB n-doped region 904 and layer 942 from the respective P-DEMOS n-doped region 932 and layer 940, a p-doped gap 1012 is inserted therebetween. The p-doped gap 1012 can be a part of the p-doped substrate 301 without further doping. Alternatively, the p-doped gap 1012 can be a p-doped region extending from the top surface 306 of the substrate 301 and have a higher dopant concentration than the substrate 301. Either way, the p-doped gap 1012 has a minimum length of 4 μm. Moreover, terminal field plates 1014 and 1016 are formed along an outer boundary of the n-doped body region 932 and the n-doped barrier region 931. That way, the P-DEMOS transistor 910 can be insulated within the notch portion 904 of the barrier structure 902, and it can also be interposed between two ESD guard ring components, such as the LDMOS transistor 350 and the diode 310 (see, supra, FIG. 10). Advantageously, integrating the P-DEMOS transistor 910 into the ESD guard ring structure allows the overall high side gate driver (e.g., HSGD 620) to be arranged in a space-efficient manner with little to no area penalty or wire routing penalty.

The P-DEMOS transistor 910 includes the gate structure 938. The gate structure 938 is positioned above the top surface 306, and it extends across the drain extended region 924 and the body region 932. A channel region is defined under the gate structure 938 in the body region 932 that is positioned between the drain extended region 924 and the source contact region 934. A dielectric layer (e.g., silicon oxide) 939 is formed on the drain extended region 924. Field plates 1008 may be formed on the dielectric layer 939. The field plates 1008 can be formed with the same material and same process steps as the gate structure 938 and the terminal field plates 1014 and 1016. In one implementation, for example, the field plates 1008 may include a polysilicon material. The field plates 1008 has a field plate density of about 50% or greater, which can be understood as a ratio of a field plate width over an inter-plate spacing. As an example, the field plates 1008 has a density of 50% where each field plate has a width of about 0.5 μm and the inter-plate spacing is about 0.5 μm. This relatively high field plate density provides benefits to the operations of the P-DEMOS transistor 910. In one aspect, the high density field plates 1008 improve the on resistance $R_{SD\_ON}$ between the drain contact region 921 and the source contact region 934 by blocking surface charges above the drain extended region 924. In another aspect, the high density field plates 1008 enhance the breakdown voltage stability by providing a more uniform electric field distribution across one or more pn junctions.

Figure 11:
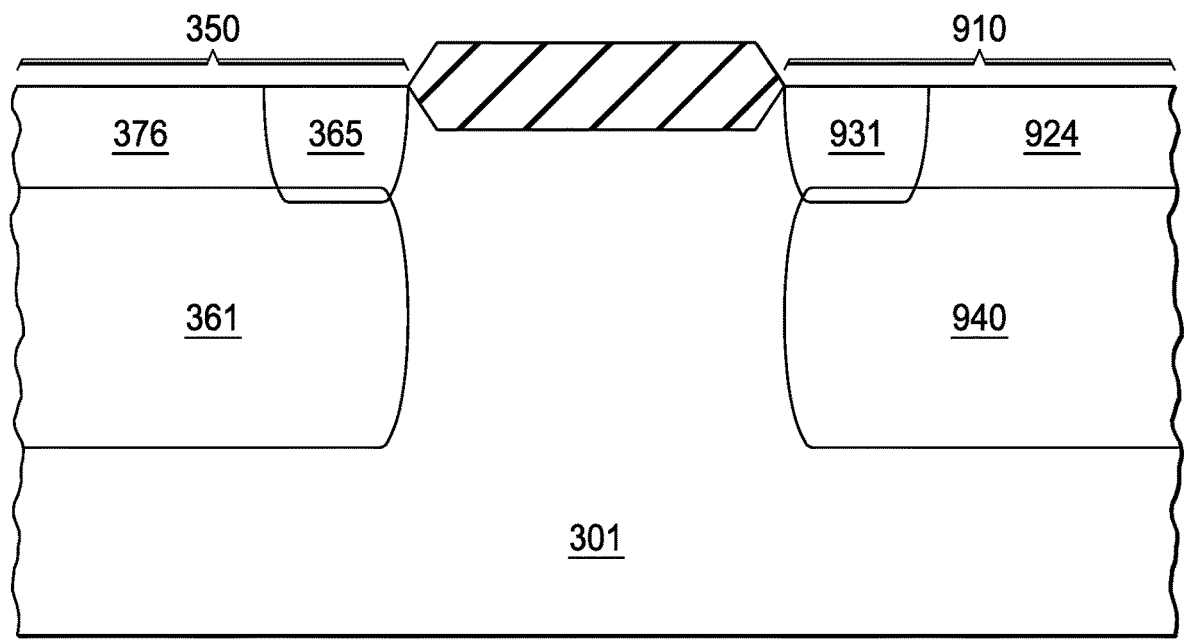
FIG. 11 shows a partial traverse cross-sectional view of the p-channel device according to an aspect of the present disclosure.

FIG. 11 shows a partial cross-sectional view along a channel width direction of the P-DEMOS transistor 910. As a part of the ESD guard ring integration process, the P-DEMOS transistor 910 can be fabricated alongside with the LDMOS transistor 350. The n-doped buried layer 940 of the P-DEMOS transistor 910 and the n-doped buried layer 361 can be formed under a first set of same process steps. While the n-doped buried layer 940 serves as a RESURF region for the P-DEMOS transistor 910, the n-doped buried layer 361 serves as a drain drift region for the LDMOS transistor 350. As such, the n-type RESURF region of the P-DEMOS transistor 910 is substantially coplanar with the n-type drain drift region of the LDMOS transistor 350 as these two regions are patterned, doped, and annealed under the same process steps.

Likewise, the n-doped barrier region 931 of the P-DEMOS transistor 910 and the n-doped isolation drain region 365 of the LDMOS transistor 350 are coplanar with each other as they can be formed under a second set of same process steps. Furthermore, the p-doped drain region 924 of the P-DEMOS transistor 910 and the p-doped RESURF region 376 of the LDMOS transistor 350 can be understood as being coplanar with each other because they each has a similar topology with respect to their surrounding n-doped tank structures. Advantageously, this integration process allows the fabrication of a pair of complementary drain extended transistors (e.g., the drain extended PMOS 910 and the drain extended NMOS 350) in the ESD guard ring. This fabrication process is process efficient because no additional process steps are required to form the drain extended PMOS 910 aside from the existing process steps for forming the drain extended NMOS 350. Moreover, the layout of the ESD guard ring with complementary devices is space efficient because no additional space is required within the circuit region 202 (see, supra, FIG. 6).

Consistent with the present disclosure, the term "configured to" purports to describe the structural and functional characteristics of one or more tangible non-transitory components. For example, the term "configured to" can be understood as having a particular configuration that is designed or dedicated for performing a certain function. Within this understanding, a device is "configured to" perform a certain function if such a device includes tangible non-transitory components that can be enabled, activated, or powered to perform that certain function. While the term "configured to" may encompass the notion of being configurable, this term should not be limited to such a narrow definition. Thus, when used for describing a device, the term "configured to" does not require the described device to be configurable at any given point of time.

Moreover, the term "exemplary" is used herein to mean serving as an example, instance, illustration, etc., and not necessarily as advantageous. Also, although the disclosure has been shown and described with respect to one or more implementations, equivalent alterations and modifications will be apparent upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

Consistent with the present disclosure, the terms "about," "approximately," "substantially the same," "substantially equal to" and "substantially equal" as applied to features of an integrated circuit is understood to mean equal within fabrication tolerances used to form the integrated circuit or to perform one or more functions by the integrated circuit. More specifically, the terms "about," "approximately," "substantially the same," "substantially equal to" and "substantially equal" purport to describe a quantitative relationship between two objects. This quantitative relationship may prefer the two objects to be equal by design but with the anticipation that a certain amount of variations can be introduced by the fabrication process. In one aspect, a first resistor may have a first resistance that is substantially equal to a second resistance of the second resistor where the first and second resistors are purported to have the same resistance yet the fabrication process introduces slight variations between the first resistance and the second resistance. Thus, the first resistance can be substantially equal to the second resistance even when the fabricated first and second resistors demonstrate slight difference in resistance. This slight difference may be within 5% of the design target. In another aspect, a first resistor may have a first resistance that is substantially equal to a second resistance of a second resistor where the process variations are known a priori, such that the first resistance and the second resistance can be preset at slightly different values to account for the known process variations. Thus, the first resistance can be substantially equal to the second resistance even when the design values of the first and second resistance are preset to include a slight difference to account for the known process variations. This slight difference may be within 5% of the design target.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above should not be understood as requiring such separation in all embodiments.

What is claimed is:

1. An integrated circuit, comprising:
   a p-type substrate having a first circuit region and a second circuit region;
   an n-doped barrier structure segregating the first circuit region from the second circuit region, the n-doped barrier structure having a notch with an opening facing away from the first circuit region; and
   a p-type drain-extended metal oxide semiconductor (P-DEMOS) transistor positioned partially within the notch, the P-DEMOS transistor including:
   a p-doped drain region extending along a length dimension between a first end and a second end, and extending along a width dimension between a first side and a second side;
   an n-doped body region circumscribing the p-doped drain region along the first and second ends and the first and second sides; and
   a p-doped source contact separated from the p-doped drain region by the n-doped body region near the second end.

2. The integrated circuit of claim 1, in which the P-DEMOS transistor is positioned completely within the notch.

3. The integrated circuit of claim 1, in which the p-doped drain region includes:
   a highly doped region near the first end, and having a first dopant concentration and first length along the length dimension; and
   a lightly doped region between the highly doped region and the n-doped body region, and having a second dopant concentration and second length along the length dimension, the second dopant concentration lower than the first dopant concentration, and the second length greater than the first length.

4. The integrated circuit of claim 1, in which the n-doped barrier structure includes a contiguous ring structure circumscribing the first circuit region.

5. The integrated circuit of claim 1 in which the first circuit region is a high voltage region.

6. The integrated circuit of claim 1 in which the n-doped barrier structure is a contiguous ring structure circumscribing the first circuit region.

7. The integrated circuit of claim 1 in which the n-doped barrier structure is a segmented ring structure circumscribing the first circuit region.

8. The integrated circuit of claim 1 in which the n-doped barrier structure isolates high voltage operations in the first circuit region from reaching the second circuit region.

9. The integrated circuit of claim 1 including a segmented electrostatic guard ring surrounding the first circuit region that includes the n-doped barrier structure.

10. The integrated circuit of claim 1 including a segmented electrostatic guard ring surrounding the first circuit region that includes the P-DEMOS transistor and a diode segment.

11. The integrated circuit of claim 1 including a segmented electrostatic guard ring surrounding the first circuit region that includes the P-DEMOS transistor and a lateral drain metal oxide semiconductor (LDMOS) transistor segment.

12. The integrated circuit of claim 1 including a segmented electrostatic guard ring surrounding the first circuit region that includes the P-DEMOS transistor, a diode segment, and a lateral drain metal oxide semiconductor (LDMOS) transistor segment.

13. The integrated circuit of claim 1 in which the second circuit region is a low voltage region.

14. An integrated circuit, comprising:
   a p-doped substrate having a first circuit region and a second circuit region;
   an n-doped barrier structure between the first circuit region and the second circuit region, the n-doped barrier structure including first and second colinear segments both having a side toward the second circuit region, a first notch segment extending from the first colinear segment toward the first circuit region, a second notch segment extending from the second colinear segment toward the first circuit region, and a third notch segment that connects the first and second notch segments; and a p-doped drain-extended metal oxide semiconductor (P-DEMOS) transistor, including:
    a p-doped drain region bounded horizontally by an n-doped body region an n-doped body region; and
    a p-doped source contact spaced apart from the p-doped drain region by the n-doped body region,
wherein the n-doped body region extends toward the second circuit region past the sides of the first and second colinear segments.

15. The integrated circuit of claim 14, in which the n-doped barrier structure includes a contiguous ring structure circumscribing the first circuit region.

16. The integrated circuit of claim 14 in which the first circuit region is a high voltage region.

17. The integrated circuit of claim 14 in which the n-doped barrier structure is a segmented ring structure circumscribing the first circuit region.

18. The integrated circuit of claim 14 in which the n-doped barrier structure isolates high voltage operations in the first circuit region from low voltage operations in the second circuit region.

19. An integrated circuit, comprising:
    a semiconductor substrate having a high-voltage circuit region and a low-voltage circuit region;
    an n-type barrier structure between the high-voltage circuit region and the low-voltage circuit region, the n-type barrier structure including first and second colinear segments and a third segment parallel to and spaced apart from the colinear segments toward the high-voltage circuit region; and
    a p-type drain-extended metal oxide semiconductor (P-DEMOS) transistor, including:
        a p-type drain region surrounded horizontally by an n-type body region and an n-type barrier region; and
        a p-type source contact spaced apart from the p-type drain region by the n-type body region,
    wherein the n-type barrier region extends between the first and second colinear segments.

20. The integrated circuit of claim 19 in which the high-voltage circuit region is configured to operate up to about 700V, and the low-voltage circuit region is configured to operate at 15V or less.

* * * * *